(12) United States Patent
Okamoto et al.

(10) Patent No.: US 8,969,921 B2
(45) Date of Patent: Mar. 3, 2015

(54) SEMICONDUCTOR DEVICE AND MANUFACTURING METHOD THEREOF

(71) Applicant: Fujitsu Limited, Kawasaki-shi, Kanagawa (JP)

(72) Inventors: Naoya Okamoto, Isehara (JP); Yuichi Minoura, Zama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/845,750

(22) Filed: Mar. 18, 2013

(65) Prior Publication Data

US 2013/0214287 A1 Aug. 22, 2013

Related U.S. Application Data

(63) Continuation of application No. PCT/JP2010/068466, filed on Oct. 20, 2010.

(51) Int. Cl.
*H01L 29/47* (2006.01)
*H01L 29/20* (2006.01)
*H01L 21/8252* (2006.01)
*H01L 27/06* (2006.01)
*H01L 29/205* (2006.01)
(Continued)

(52) U.S. Cl.
CPC ........ *H01L 29/2003* (2013.01); *H01L 21/8252* (2013.01); *H01L 27/0605* (2013.01); *H01L 29/205* (2013.01); *H01L 29/872* (2013.01); *H01L 21/0254* (2013.01); *H01L 29/66212* (2013.01); *H01L 29/475* (2013.01); *H01L 29/7787* (2013.01)
USPC ........... 257/201; 257/472; 438/571; 438/572; 438/172

(58) Field of Classification Search
CPC ............ H01L 21/8252; H01L 21/0254; H01L 27/0605; H01L 29/2003; H01L 29/66212; H01L 29/7787; H01L 29/205; H01L 29/872; H01L 29/475
USPC ..................................... 257/76; 438/167, 478
See application file for complete search history.

(56) References Cited

U.S. PATENT DOCUMENTS

2003/0098462 A1* 5/2003 Yoshida ........................ 257/183
2009/0061576 A1* 3/2009 Okamoto ...................... 438/191
(Continued)

FOREIGN PATENT DOCUMENTS

JP 2004-39784 A1 2/2004
JP 2008-177369 A1 7/2008
(Continued)

OTHER PUBLICATIONS

U. Karrer, et al; "Influence of crystal polarity on the properties of Pt/GaN Schottky diodes;" Applied Physics Letters; vol. 77; No. 13; Sep. 25, 2000; pp. 2012-2014 (3 Sheets)/Cited in International Search Report.

(Continued)

*Primary Examiner* — Olik Chaudhuri
*Assistant Examiner* — Christine Enad
(74) *Attorney, Agent, or Firm* — Kratz, Quintos & Hanson, LLP

(57) ABSTRACT

A semiconductor device is provided with: a GaN layer; an anode electrode that forms a Schottky junction with a Ga face of the GaN layer; and an InGaN layer positioned between at least a part of the anode electrode and the GaN layer.

15 Claims, 28 Drawing Sheets

(51) Int. Cl.
*H01L 29/872* (2006.01)
*H01L 21/02* (2006.01)
*H01L 29/66* (2006.01)
*H01L 29/778* (2006.01)

(56) References Cited

U.S. PATENT DOCUMENTS

| | | | | |
|---|---|---|---|---|
| 2010/0301347 A1* | 12/2010 | Chung et al. | | 257/76 |
| 2011/0049526 A1* | 3/2011 | Chu et al. | | 257/76 |
| 2012/0007097 A1* | 1/2012 | Hebert | | 257/76 |

FOREIGN PATENT DOCUMENTS

| | | | |
|---|---|---|---|
| JP | 2008-177487 A1 | 7/2008 |
| JP | 2008-244505 A1 | 10/2008 |
| JP | 2010-40698 A1 | 2/2010 |

OTHER PUBLICATIONS

O. Ambacher, et al.; "Two-dimensional electron gases induced by spontaneous and piezoelectric polarization charges in N- and Ga-face AlGaN/GaN heterostructures;" Journal of Applied Physics; vol. 85; No. 6; Mar. 15, 1999; pp. 3222-3233 and cover sheet (13 Sheets)/p. 22 of specification.

M. Park, et al.; "Micro-Raman study of electronic properties of inversion domains in GaN-based lateral polarity heterostructures;" Journal of Applied Physics; vol. 93; No. 12; Jun. 15, 2003; pp. 9542-9547 and cover sheet (7 Sheets)/p. 22 of specification.

W.-C. Yang et al.; "Photoelectron emission microscopy observation of inversion domain boundaries of GaN-based lateral polarity heterostructures;" Journal of Applied Physics; vol. 94; No. 9; Nov. 1, 2003; pp. 5720-5725 and cover sheet (7 Sheets)/p. 22 of specification.

M. H. Wong, et al.; "Polarity inversion of N-face GaN by plasma-assisted molecular beam epitaxy;" Journal of Applied Physics; vol. 104; 2008; pp. 093710-1-093710-6 and cover sheet (7 Sheets)/p. 22 of specification.

International Search Report for International Application No. PCT/JP2010/068466 dated Jan. 25, 2011.

* cited by examiner

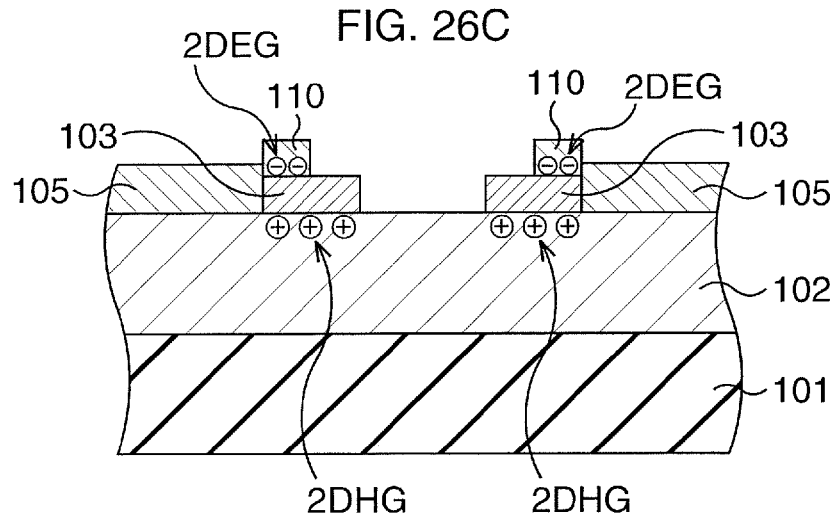
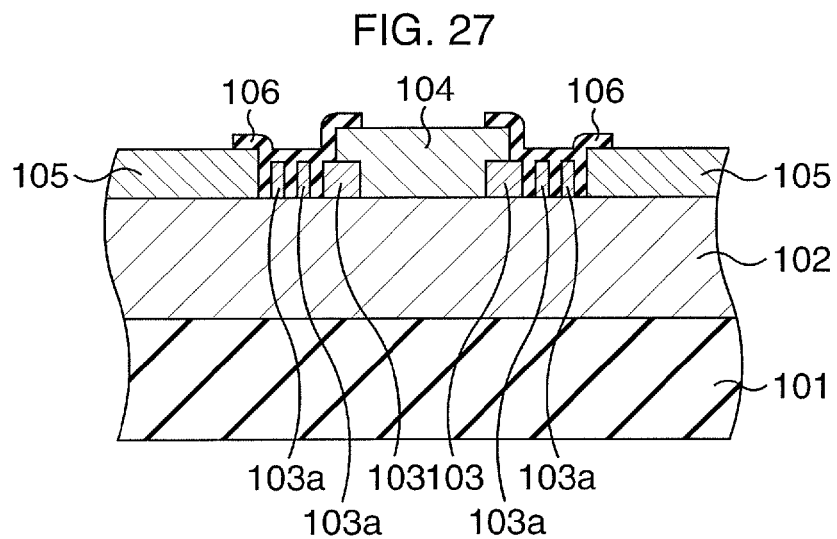
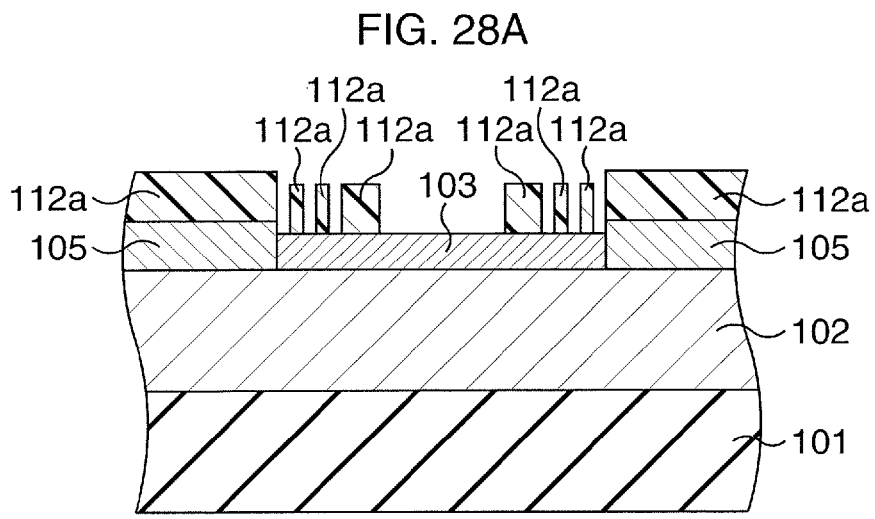

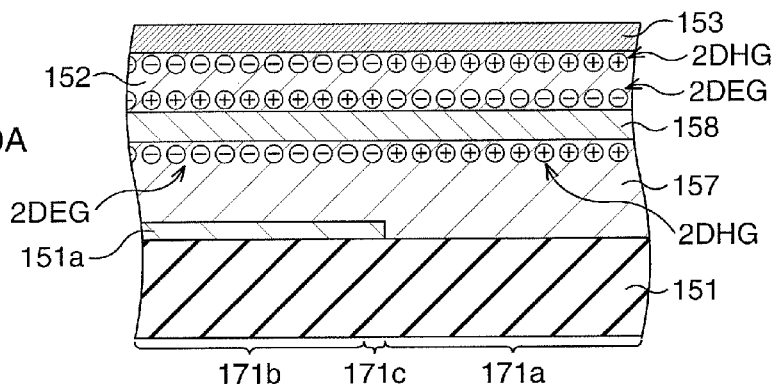
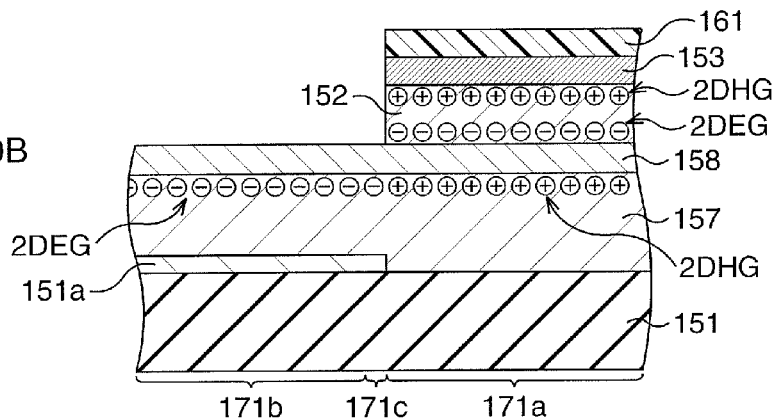
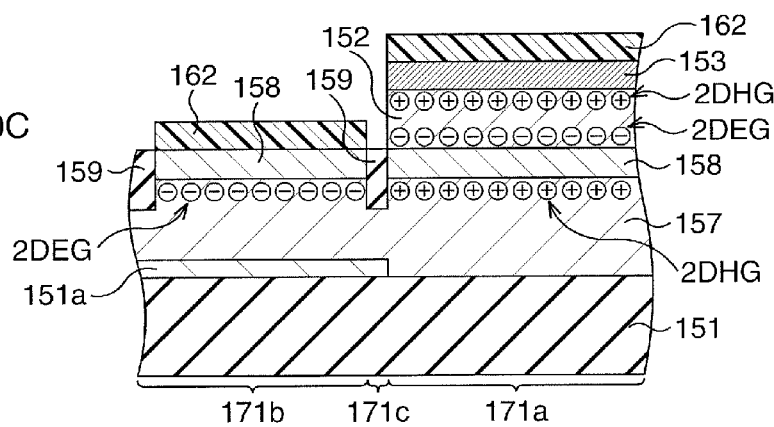

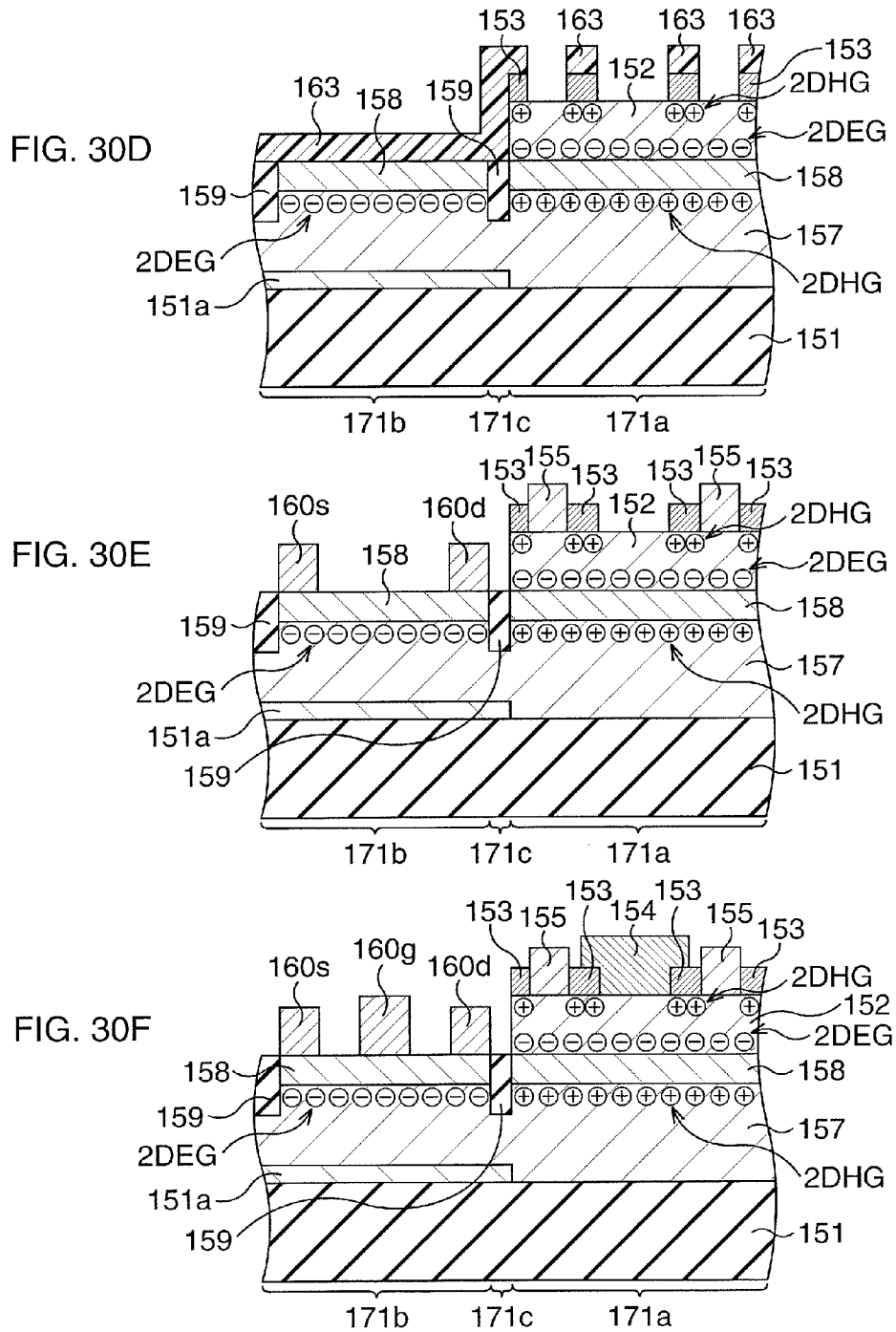

SEMICONDUCTOR DEVICE AND MANUFACTURING METHOD THEREOF

CROSS-REFERENCE TO RELATED APPLICATION

This application is a continuation application of International Application PCT/JP2010/068466 filed on Oct. 20, 2010 and designated the U.S., the entire contents of which are incorporated herein by reference.

FIELD

The present invention relates to a semiconductor device and a manufacturing method thereof.

BACKGROUND

A GaN-based Schottky barrier diode (GaN-SBD: Schottky barrier diode) is expected, because of its physical characteristic, to be applied to a server system and the like as a device having a high breakdown voltage and capable of performing high-speed operation. In order to reduce an energy loss in a GaN-SBD, it is important to lower an on-resistance and a forward voltage. For lowering the on-resistance and the forward voltage, it is effective to lower a work function of an anode electrode (Schottky electrode). Meanwhile, the work function of the anode electrode and the backward breakdown voltage are in a tradeoff relation. Therefore, when the work function of the anode electrode is lowered to lower the on-resistance and the forward voltage, the backward breakdown voltage is lowered.

For the realization of high breakdown voltage, there has been proposed a structure in which an Mg-doped p-type GaN layer is provided between an outer peripheral portion of an anode electrode and an n-type GaN layer which forms a Schottky junction with the anode electrode. In order to obtain the structure, there is a need to form a p-type GaN layer on an n-type GaN layer, perform patterning of the p-type GaN layer by dry etching to expose a front surface (Schottky surface) of the n-type GaN layer, and form an anode electrode on the Schottky surface.

However, Mg is difficult to be activated, and even if activation annealing is performed at 1000° C. or higher, only about 1% of a doped amount is activated. For this reason, when forming the p-type GaN layer, in order to sufficiently secure activated Mg, there is a need to dope a large amount of Mg of $1 \times 10^{19}$ cm$^{-3}$ or more, and perform activation annealing at 1000° C. or higher. When the large amount of Mg is doped, crystallinity of the p-type GaN layer is easily reduced. Further, a roughness of a Schottky surface of an n-type GaN layer, which is exposed after performing patterning of the p-type GaN layer, is easily caused, resulting in that the yield is easily reduced. Further, when performing dry etching, a roughness of the p-type GaN layer itself is easily caused. For this reason, it is extremely difficult to realize the practical application of the structure in which the Mg-doped p-type GaN layer is provided.

Patent Literature 1: Japanese Laid-open Patent Publication No. 2008-177369
Patent Literature 2: Japanese Laid-open Patent Publication No. 2010-40698

SUMMARY

An aspect of a semiconductor device is provided with: a GaN layer; an anode electrode that forms a Schottky junction with a Ga face of the GaN layer; and an InGaN layer positioned between at least a part of the anode electrode and the GaN layer.

Another aspect of a semiconductor device is provide with: a GaN layer; an anode electrode that forms a Schottky junction with an N face of the GaN layer; and a nitride semiconductor layer containing Al, having a band gap larger than that of GaN, and positioned between at least a part of the anode electrode and the GaN layer.

In an aspect of a manufacturing method of a semiconductor device, an InGaN layer is locally formed over a Ga face of a GaN layer, and an anode electrode that forms a Schottky junction with the GaN layer is formed so as to make the InGaN layer to be positioned between at least a part of the anode electrode and the GaN layer.

In another aspect of a manufacturing method of a semiconductor device, a nitride semiconductor layer containing Al and having a band gap larger than that of GaN is locally formed over an N face of a GaN layer, and an anode electrode that forms a Schottky junction with the nitride semiconductor layer is formed so as to make the nitride semiconductor layer to be positioned between at least a part of the anode electrode and the GaN layer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 26C is a sectional view illustrating the method of manufacturing the semiconductor device, continued from FIG. 26B.

FIG. 27 is a sectional view illustrating a structure of a semiconductor device according to a fifteenth embodiment.

FIG. 28A is a sectional view illustrating a method of manufacturing the semiconductor device according to the fifteenth embodiment.

FIG. 30A is a sectional view illustrating a method of manufacturing the semiconductor device according to the sixteenth embodiment.

FIG. 30B is a sectional view illustrating the method of manufacturing the semiconductor device, continued from FIG. 30A.

FIG. 30C is a sectional view illustrating the method of manufacturing the semiconductor device, continued from FIG. 30B.

FIG. 30D is a sectional view illustrating the method of manufacturing the semiconductor device, continued from FIG. 30C.

FIG. 30E is a sectional view illustrating the method of manufacturing the semiconductor device, continued from FIG. 30D.

FIG. 30F is a sectional view illustrating the method of manufacturing the semiconductor device, continued from FIG. 30E.

DESCRIPTION OF EMBODIMENTS

Hereinafter, embodiments will be concretely described with reference to the attached drawings.

First Embodiment

Figure 1A:
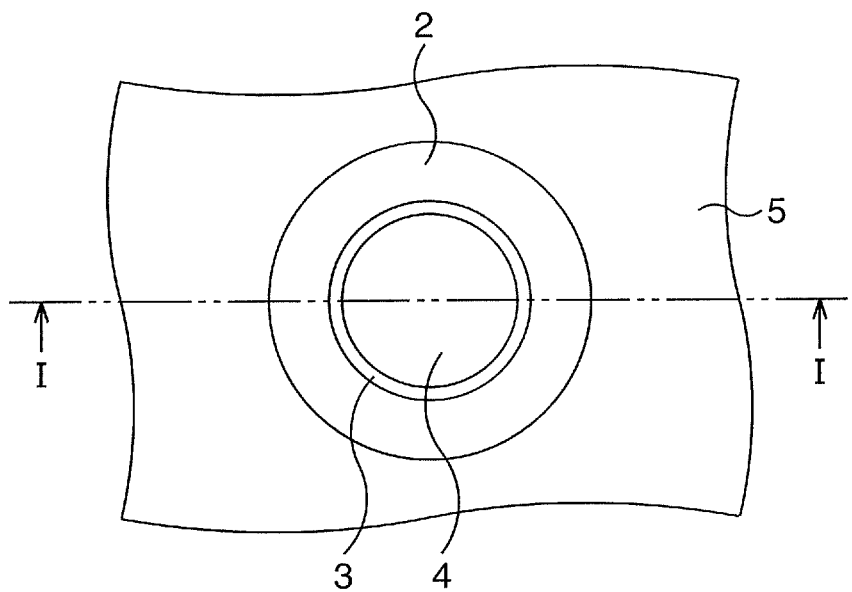
FIG. 1A is a plan view illustrating a structure of a semiconductor device according to a first embodiment.

First, a first embodiment will be described. FIG. 1A is a plan view illustrating a structure of a semiconductor device (Schottky barrier diode) according to the first embodiment, and FIG. 1B is a sectional view taken along a line I-I in FIG. 1A.

Figure 1B:
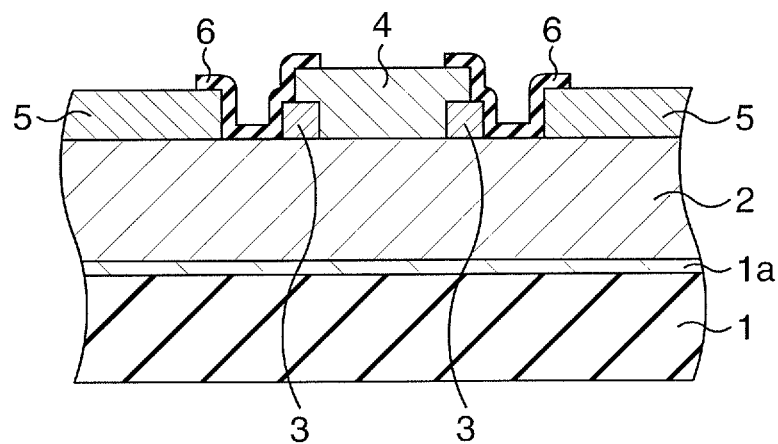
FIG. 1B is a sectional view taken along a line I-I in FIG. 1A.

In the first embodiment, as illustrated in FIG. 1A and FIG. 1B, an AlN nucleus formation layer 1a is formed over a sapphire substrate 1, and an re-type GaN layer 2 is formed over the AlN nucleus formation layer 1a. A front surface of the n-type GaN layer 2, which is over the AlN nucleus formation layer 1a, is a Ga face ((0001) plane according to Miller index notation). A ring-shaped InGaN layer 3 is formed as a guard ring over the n-type GaN layer 2. Further, an anode electrode (Schottky electrode) 4 that forms a Schottky junction with the n-type GaN layer 2 is formed on the inside of the InGaN layer 3. The anode electrode 4 has a thickness greater than that of the InGaN layer 3, and an outer peripheral portion of the anode electrode 4 is brought into contact with an upper surface of the InGaN layer 3. Further, a cathode electrode (ohmic electrode) 5 that forms an ohmic junction with the n-type GaN layer 2 is formed at a position apart from the InGaN layer 3. Further, a passivation film 6 covering the n-type GaN layer 2 and the InGaN layer 3 is formed between the anode electrode 4 and the cathode electrode 5. The passivation film 6 also covers, from above, a part of the anode electrode 4 and a part of the cathode electrode 5. Note that the passivation film 6 is omitted in FIG. 1A.

Figure 2:
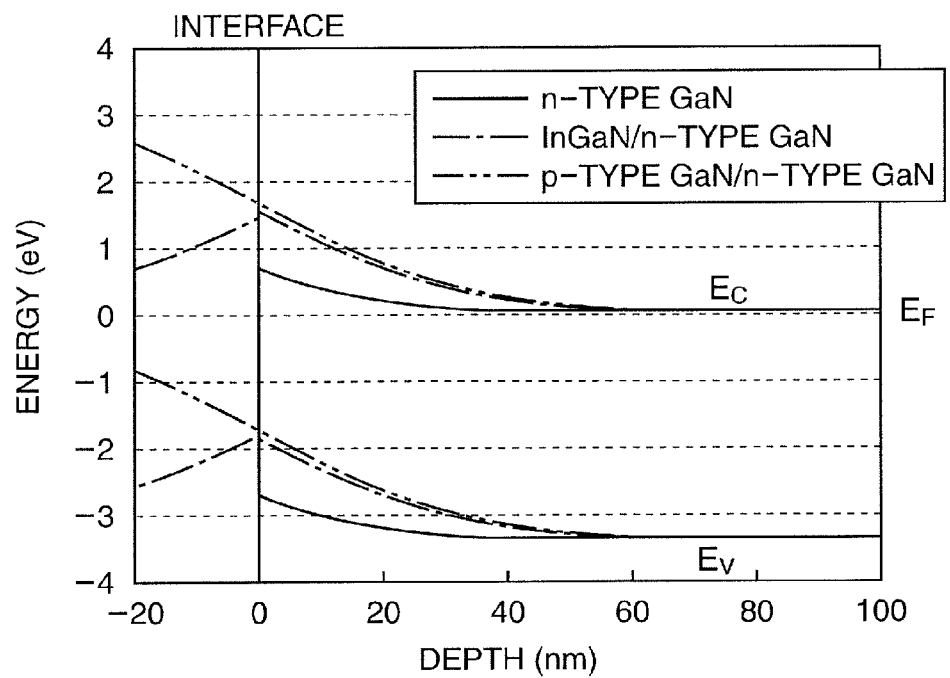
FIG. 2 is a diagram illustrating a change in band potentials.

Here, explanation will be made on an function of the InGaN layer 3. FIG. 2 is a diagram illustrating a result of simulation regarding a change in band potentials. FIG. 2 illustrates respective band potentials of a structure formed only of an n-type GaN layer whose front surface has a Ga face (solid line), a structure formed of an n-type GaN layer whose front surface has a Ga face and an InGaN layer formed over the n-type GaN layer (dashed line), and a structure formed of an n-type GaN layer whose front surface has a Ga face and a p-type GaN layer formed over the n-type GaN layer (two-dot chain line). Note that a concentration of activated n-type impurity in the n-type GaN layer was set to $5\times10^{17}$ cm$^{-3}$. An In composition of the InGaN layer was set to 6%, and a thickness of the layer was set to 20 nm. A concentration of activated p-type impurity in the p-type GaN layer was set to $5\times10^{17}$ cm$^{-3}$, and a thickness of the layer was set to 200 nm. A horizontal axis in FIG. 2 indicates a depth of the n-type GaN layer from the front surface, and a negative value indicates a distance from an interface between the n-type GaN layer and the InGaN layer or the p-type GaN layer (depth: 0 nm) to a position in the InGaN layer or the p-type GaN layer.

As illustrated in FIG. 2, the band potential at the interface between the n-type GaN layer and the p-type GaN layer in the structure formed of the n-type GaN layer and the p-type GaN layer (two-dot chain line) is higher than that of the structure formed only of the n-type GaN layer (solid line). Because of such an effect, a backward breakdown voltage is improved in a prior structure provided with a p-type GaN layer.

In like manner, the band potential at the interface between the n-type GaN layer and the InGaN layer in the structure formed of the n-type GaN layer and the InGaN layer (dashed line) is also higher than that of the structure formed only of the n-type GaN layer (solid line). This is because, the band potential at the interface between the InGaN layer grown on the Ga face in a c-axis direction and the n-type GaN layer is increased by a negative fixed charge because of spontaneous polarization and piezoelectric polarization. Therefore, the backward breakdown voltage is improved, similar to the case of the structure formed of the n-type GaN layer and the p-type GaN layer.

Figure 3:
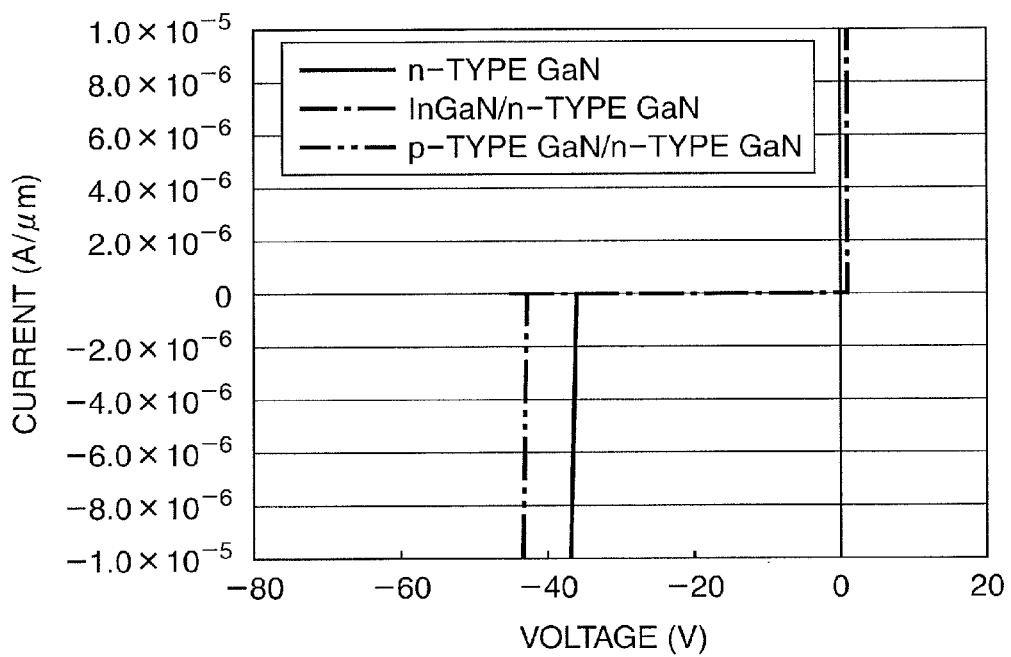
FIG. 3 is a diagram illustrating a change in current-voltage characteristics.

FIG. 3 is a diagram illustrating a result of simulation regarding a change in current-voltage characteristics. FIG. 3 illustrates respective current-voltage characteristics of a structure formed only of an n-type GaN layer whose front surface has a Ga face (solid line), a structure formed of an n-type GaN layer whose front surface has a Ga face and an InGaN layer formed over the n-type GaN layer (dashed line), and a structure formed of an n-type GaN layer whose front surface has a Ga face and a p-type GaN layer formed over the n-type GaN layer (two-dot chain line). Note that a concentration of activated n-type impurity in the n-type GaN layer was set to $1\times10^{16}$ cm$^{-3}$. In the structure formed of the n-type GaN layer and the InGaN layer (dashed line), an In composition was set to 5%, a thickness of the InGaN layer was set to 20 nm, and a negative fixed charge of $-4.59\times10^{12}$ cm$^{-2}$ was set to exist in the vicinity of an interface of the InGaN layer with the n-type GaN layer. In the structure formed of the n-type GaN layer and the p-type GaN layer (two-dot chain line), a thickness of the p-type GaN layer was set to 20 nm, and a concentration of acceptor was set to $2\times10^{17}$ cm$^{-3}$.

As illustrated in FIG. 3, while the backward breakdown voltage of the structure formed only of the n-type GaN layer (solid line) is −36.1 V, the backward breakdown voltage of the structure formed of the n-type GaN layer and the p-type GaN layer (two-dot chain line) is high to be −42.7 V. Further, an absolute value of the backward breakdown voltage of the structure formed of the n-type GaN layer and the InGaN layer (dashed line) is 44.8 V or greater, which is higher than that of the backward breakdown voltage of the structure formed of the n-type GaN layer and the p-type GaN layer (two-dot chain line).

As is apparent from the results of these simulations, according to the first embodiment, it is possible to obtain a backward breakdown voltage higher than that of a GaN-based SBD in which the InGaN layer 3 does not exist and a GaN-based SBD in which the p-type GaN layer is used as a guard ring.

Next, a method of manufacturing the semiconductor device according to the first embodiment will be described. FIG. 4A to FIG. 4K are sectional views illustrating the method of manufacturing the semiconductor device according to the first embodiment in the order of steps.

Figure 4A:
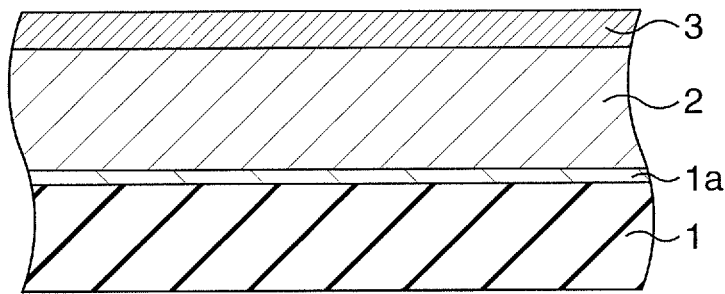
FIG. 4A is a sectional view illustrating a method of manufacturing the semiconductor device according to the first embodiment.

First, as illustrated in FIG. 4A, the AlN nucleus formation layer 1a, the n-type GaN layer 2 and the InGaN layer 3 are formed over the sapphire substrate 1 by a metal-organic vapor phase epitaxy (MOVPE) method, for example. Since the AlN nucleus formation layer 1a is formed over the sapphire substrate 1 before forming the n-type GaN layer 2, a front surface in a growth direction of the n-type GaN layer 2 has a Ga face. Further, for example, a thickness of the n-type GaN layer 2 is set to about 1 μm, and as an n-type impurity, Si of about $4 \times 10^{17}$ cm$^{-3}$ is doped. For example, a thickness of the InGaN layer 3 is set to about 20 nm, and an In composition is set to about 5% to 7%. For example, a growth temperature of the n-type GaN layer 2 is set to about 1000° C., and a growth temperature of the InGaN layer 3 is set to about 780° C.

Figure 4B:
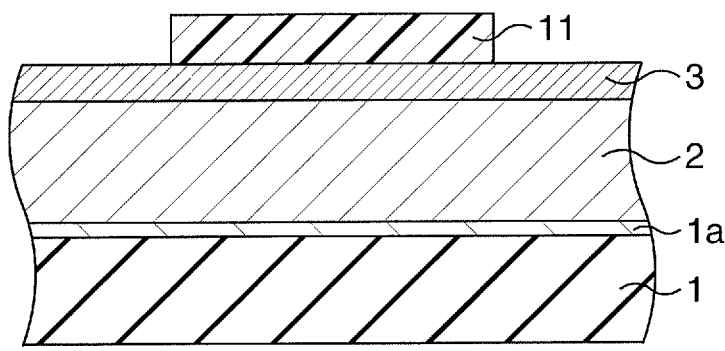
FIG. 4B is a sectional view illustrating the method of manufacturing the semiconductor device, continued from FIG. 4A.

Then, as illustrated in FIG. 4B, a resist pattern 11 having an opening at a region in which the cathode electrode 5 is to be formed is formed over the InGaN layer 3. The resist pattern 11 is formed by photolithography.

Figure 4C:
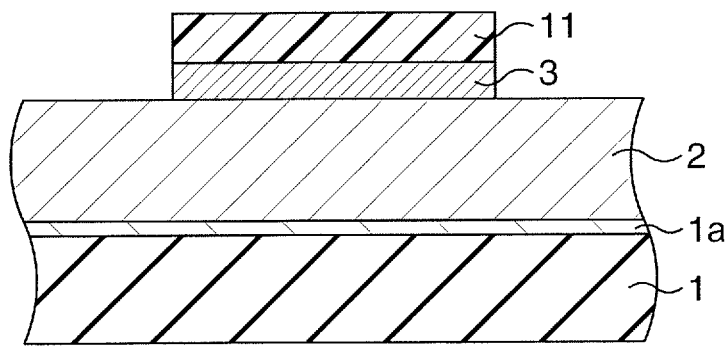
FIG. 4C is a sectional view illustrating the method of manufacturing the semiconductor device, continued from FIG. 4B.

Thereafter, as illustrated in FIG. 4C, the InGaN layer 3 is etched with the resist pattern 11 as an etching mask, to thereby make a front surface of the n-type GaN layer 2 being exposed in the region in which the cathode electrode 5 is to be formed. As the etching of the InGaN layer 3, dry etching using chlorine gas is performed, for example. An etching rate of the InGaN layer 3 is set to 10 nm/min, for example. In the etching, it is preferable to perform overetching, and an etching time is set to 4 minutes, for example. This is because, if the InGaN layer 3 remains on the region in which the cathode electrode 5 is to be formed, there is a chance that an ohmic failure occurs due to a potential barrier.

Figure 4D:
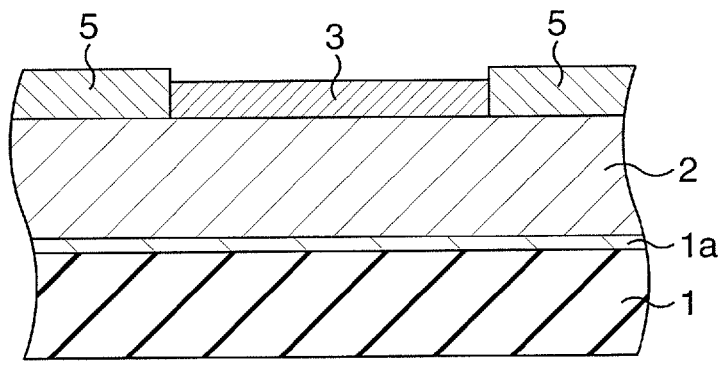
FIG. 4D is a sectional view illustrating the method of manufacturing the semiconductor device, continued from FIG. 4C.

Subsequently, as illustrated in FIG. 4D, the resist pattern 11 is removed, and the cathode electrode 5 is formed over the n-type GaN layer 2 by a lift-off method, for example. A multi-layered body of a Ti film having a thickness of about 30 nm and an Al film over the Ti film having a thickness of about 300 nm is formed as the cathode electrode 5, for example. The deposition of the Ti film and the Al film is performed through a vapor deposition method, for example. Then, rapid thermal annealing (RTA) is performed at about 600° C.

Figure 4E:
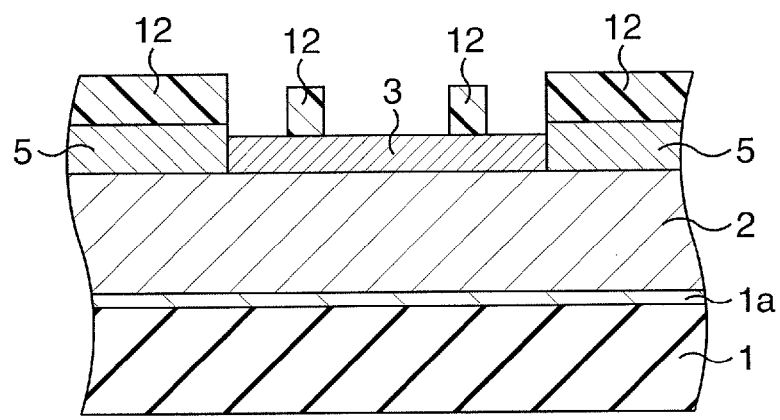
FIG. 4E is a sectional view illustrating the method of manufacturing the semiconductor device, continued from FIG. 4D.

Thereafter, as illustrated in FIG. 4E, a resist pattern 12 covering the cathode electrode 5 and covering a part of the InGaN layer 3 which is to be remained as a ring-shaped guard ring is formed. The resist pattern 12 is formed by photolithography.

Figure 4F:
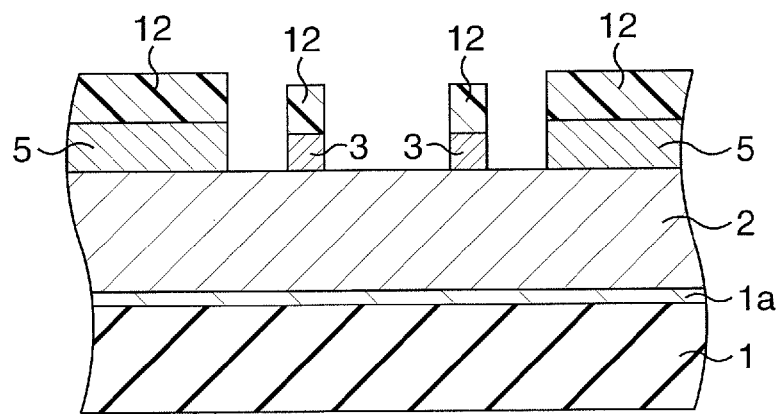
FIG. 4F is a sectional view illustrating the method of manufacturing the semiconductor device, continued from FIG. 4E.

Subsequently, as illustrated in FIG. 4F, the InGaN layer 3 is etched with the resist pattern 12 as an etching mask, to thereby make a front surface of the n-type GaN layer 2 being exposed in a region in which a Schottky junction surface is provided and a region by which the anode electrode 4 and the cathode electrode 5 are isolated. As the etching of the InGaN layer 3, dry etching using chlorine gas is performed, for example. An etching rate of the InGaN layer 3 is set to 10 nm/min, for example. Also in the etching, it is preferable to perform overetching, and an etching time is set to 3 minutes, for example. This is because, if the InGaN layer 3 remains on the region in which the Schottky junction surface is provided, there is a chance that a forward voltage is increased due to a potential barrier. The reason why the etching time may be set to be less than that at the time of making the front surface of the n-type GaN layer 2 being exposed in the region in which the cathode electrode 5 is to be formed is that, as the amount of overetching of the region in which the Schottky junction surface is provided is larger, an area of a side surface at a lower end portion of the anode electrode 4 which is brought into contact with the n-type GaN layer 2 increases, resulting in that breakdown easily occurs.

Figure 4G:
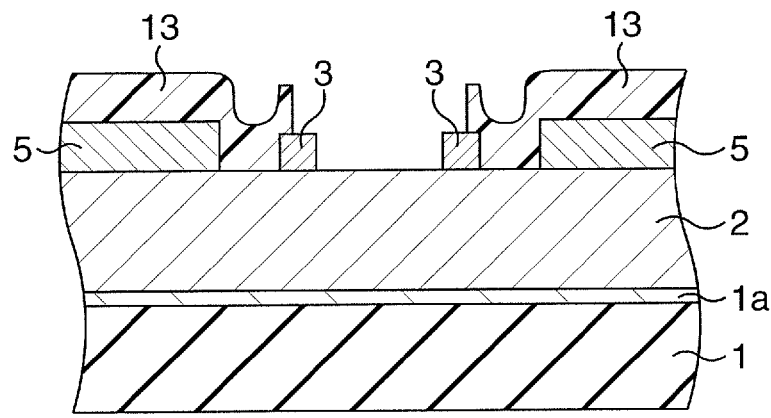
FIG. 4G is a sectional view illustrating the method of manufacturing the semiconductor device, continued from FIG. 4F.

Then, as illustrated in FIG. 4G, the resist pattern 12 is removed, and a resist pattern 13 having an opening at a region in which the anode electrode 4 is to be formed is formed. The resist pattern 13 is formed by photolithography. At this time, it is set that the opening of the resist pattern 13 overlaps a part of the InGaN layer 3.

Figure 4H:
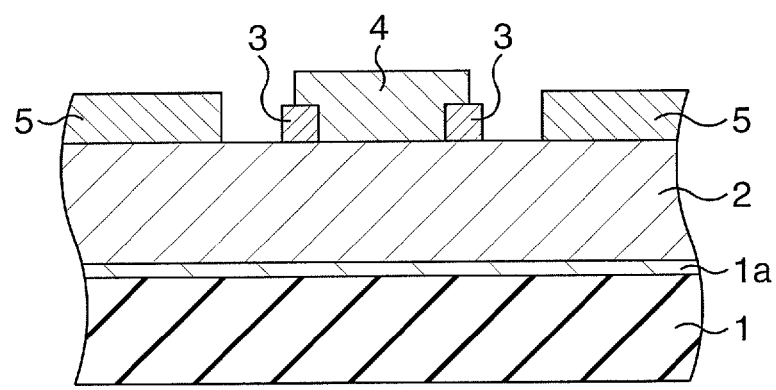
FIG. 4H is a sectional view illustrating the method of manufacturing the semiconductor device, continued from FIG. 4G.

Thereafter, as illustrated in FIG. 4H, the anode electrode 4 is formed by a lift-off method with the resist pattern 13 as a deposition mask. A multi-layered body of a TaN film having a thickness of about 100 nm and a Cu film over the TaN film having a thickness of about 300 nm is formed as the anode electrode 4, for example. The deposition of the TaN film and the Cu film is performed through a sputtering method, for example.

Figure 4I:
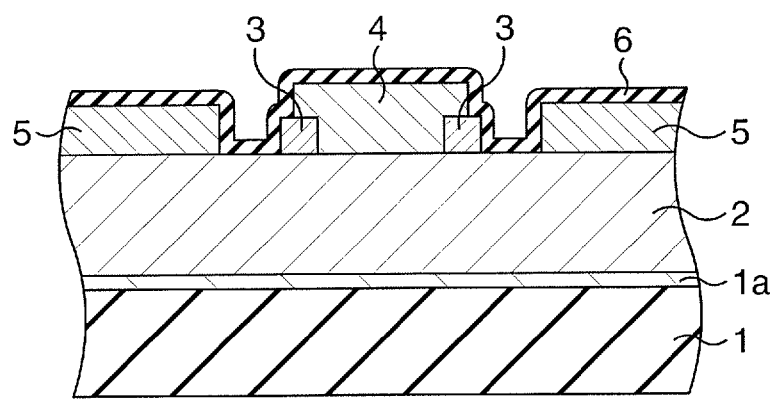
FIG. 4I is a sectional view illustrating the method of manufacturing the semiconductor device, continued from FIG. 4H.

Subsequently, as illustrated in FIG. 4I, the passivation film 6 covering the n-type GaN layer 2, the InGaN layer 3, the anode electrode 4, and the cathode electrode 5 is formed over a front surface side of the sapphire substrate 1. A silicon nitride film having a thickness of about 200 cm, for example, is formed as the passivation film 6 by a plasma CVD (chemical vapor deposition) method.

Figure 4J:
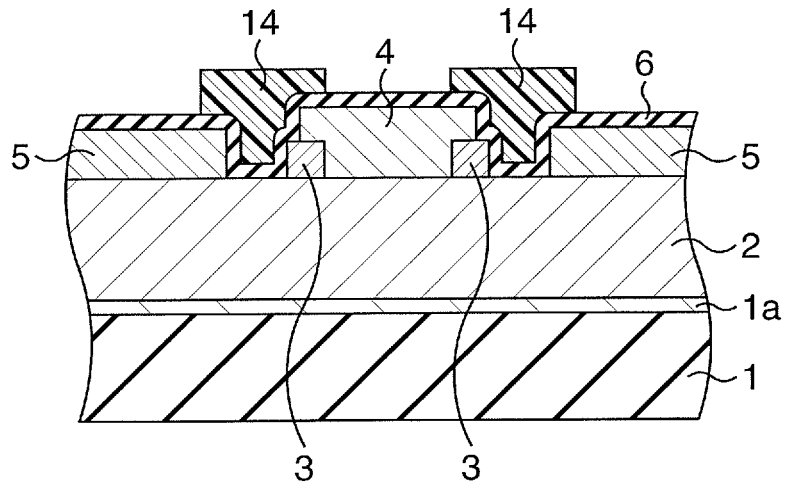
FIG. 4J is a sectional view illustrating the method of manufacturing the semiconductor device, continued from FIG. 4I.

Then, as illustrated in FIG. 4J, a resist pattern 14 having openings at a region in which a contact portion of the anode electrode 4 is to be formed and a region in which a contact portion of the cathode electrode 5 is to be formed is formed over the passivation film 6. The resist pattern 14 is formed by photolithography.

Figure 4K:
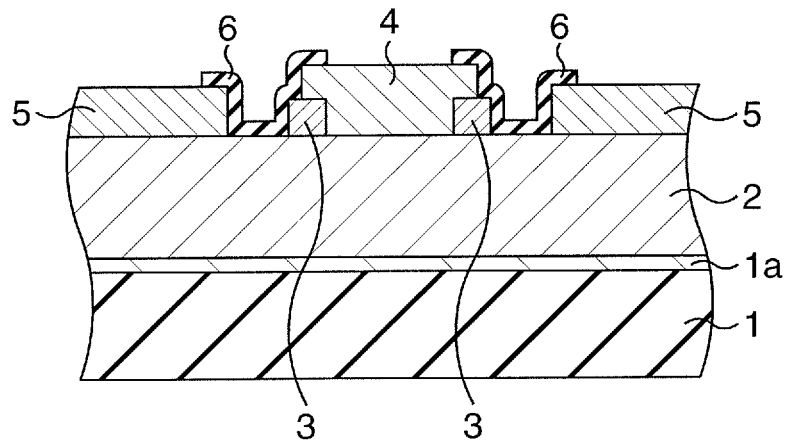
FIG. 4K is a sectional view illustrating the method of manufacturing the semiconductor device, continued from FIG. 4J.

Thereafter, as illustrated in FIG. 4K, the passivation film 6 is etched with the resist pattern 14 as an etching mask, to thereby make a part of the anode electrode 4 and a part of the cathode electrode 5 being exposed as the contact portions. As the etching of the passivation film 6, dry etching using mixed gas of SF$_6$ gas and CHF$_3$ gas is performed, for example. At this time, for example, an upper electrode power is set to 500 W, and a lower electrode power is set to 50 W. If the passivation film 6 is a silicon nitride film, an etching rate thereof is set to about 0.24 μm/min. Subsequently, the resist pattern 14 is removed.

Thus, the semiconductor device according to the first embodiment may be manufactured.

As described above, in the first embodiment, there is no need to form a p-type GaN layer containing a large amount of Mg. Therefore, it is possible to improve a backward breakdown voltage while avoiding a decrease in crystallinity and a roughness of Schottky surface caused by dry etching.

Note that it is also possible to use a GaN substrate whose front surface has a Ga face, instead of the sapphire substrate 1. In this case, the n-type GaN layer 2 may be formed over the GaN substrate without forming the AlN nucleus formation layer 1a.

When an AlGaN layer is formed over a GaN layer, if a front surface of the GaN layer has a Ga face, 2DEG is easily formed in the vicinity of an interface of the GaN layer with the AlGaN layer, because of spontaneous polarization and piezoelectric polarization. Meanwhile, if the front surface of the GaN layer has an N face, 2DHG is easily induced in the vicinity of the interface of the GaN layer with the AlGaN layer, because of spontaneous polarization and piezoelectric polarization. Such a phenomenon is described also in "O. Ambacher et al. J. Appl. Phys. Vol. 85 (1999) 3222".

Further, regarding a GaN layer grown on a C face of a sapphire substrate by a plasma assist molecular beam epitaxy (PAMBE) method, a front surface of the GaN layer which is grown directly on the sapphire substrate has an N face. Meanwhile, a front surface of a GaN layer which is grown via an AlN nucleus formation layer has a Ga face. Such a phenomenon is described also in "M. Park et al. J. Appl. Phys. Vol. 93 (2003) 9542" and "W.-C. Yang et al., J. Appl. Phys. Vol. 94 (2003) 5720". Further, a front surface of a GaN layer which is grown directly on an SiC substrate whose front surface has a C (carbon) surface has an N face. Such a phenomenon is described also in "M. H. Wong et al., J. Appl. Phys. Vol 04 (2008) 093710". A front surface of a GaN layer which is grown directly on a GaN substrate whose front surface has an N face also has an N face.

The GaN layer and the like may be grown by taking these properties into consideration.

Further, although there is no need to dope an impurity into the InGaN layer 3, it is preferable that a p-type impurity at an amount at a level of exerting no adverse effect on the crystallinity is doped into the InGaN layer 3. This is because a band potential at an interface with the n-type GaN layer 2 can be further increased. As the p-type impurity, Mg may be employed, for example, and the amount of doping at a level of exerting no adverse effect on the crystallinity may be the order of $10^{18}$ cm$^{-3}$, for example. If an activation rate of Mg is about 1%, Mg on the order of $10^{16}$ cm$^{-3}$ is activated.

Second Embodiment

Figure 5:
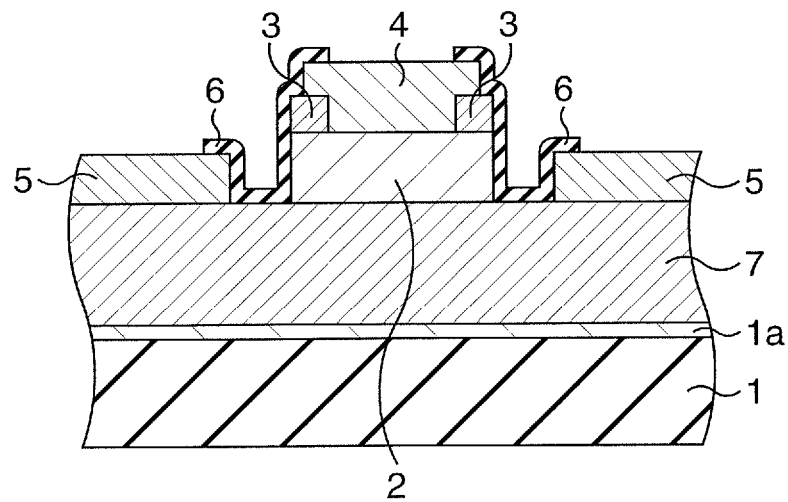
FIG. 5 is a sectional view illustrating a structure of a semiconductor device according to a second embodiment.

Next, a second embodiment will be described. FIG. 5 is a sectional view illustrating a structure of a semiconductor device (Schottky barrier diode) according to the second embodiment.

In the second embodiment, as illustrated in FIG. 5, an n$^+$GaN layer 7 into which an n-type impurity whose concentration is higher than that of the n-type GaN layer 2 is doped is formed over the AlN nucleus formation layer 1a. Further, the n-type GaN layer 2 is formed between the InGaN layer 3 and the anode electrode 4, and the n$^+$GaN layer 7, only at a position right below the InGaN layer 3 and the anode electrode 4, and the cathode electrode 5 forms an ohmic junction with, not the n-type GaN layer 2, but the n$^+$GaN layer 7. The other structure is similar to that of the first embodiment.

Also in the Schottky barrier diode having a mesa structure as described above, it is possible to achieve an effect similar to that of the first embodiment. Further, since the cathode electrode 5 is connected to the n$^+$GaN layer 7 with high-concentration n-type impurity, it is possible to further reduce an ohmic resistance.

Third Embodiment

Figure 6:
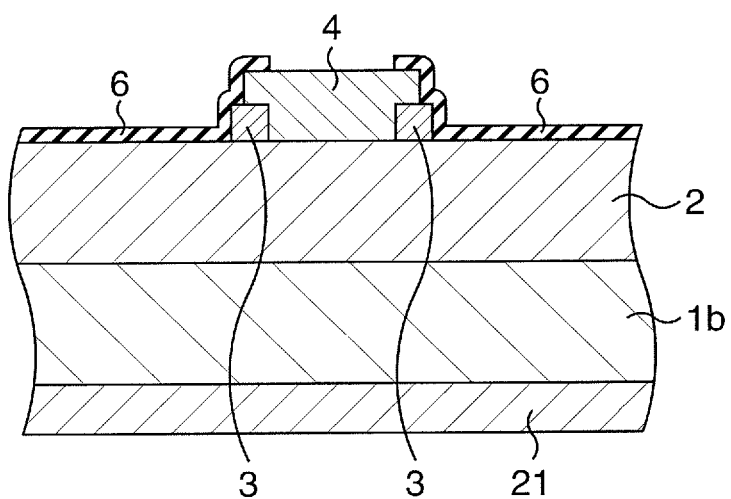
FIG. 6 is a sectional view illustrating a structure of a semiconductor device according to a third embodiment.

Next, a third embodiment will be described. FIG. 6 is a sectional view illustrating a structure of a semiconductor device (Schottky barrier diode) according to the third embodiment.

In the third embodiment, a conductive n-type GaN substrate 1b is used instead of the sapphire substrate 1. Further, as illustrated in FIG. 6, the cathode electrode 5 is not formed over the n-type GaN layer 2, and a cathode electrode 21 is formed on a rear surface of the n-type GaN substrate 1b. The other structure is similar to that of the first embodiment.

Also in the Schottky barrier diode with a vertical structure as described above, it is possible to achieve an effect similar to that of the first embodiment. Further, space saving can be realized. Further, since the cathode electrode 21 may be formed without taking the position of the anode electrode 4 and the like into consideration, it is also possible to simplify the manufacturing process.

Fourth Embodiment

Figure 7:
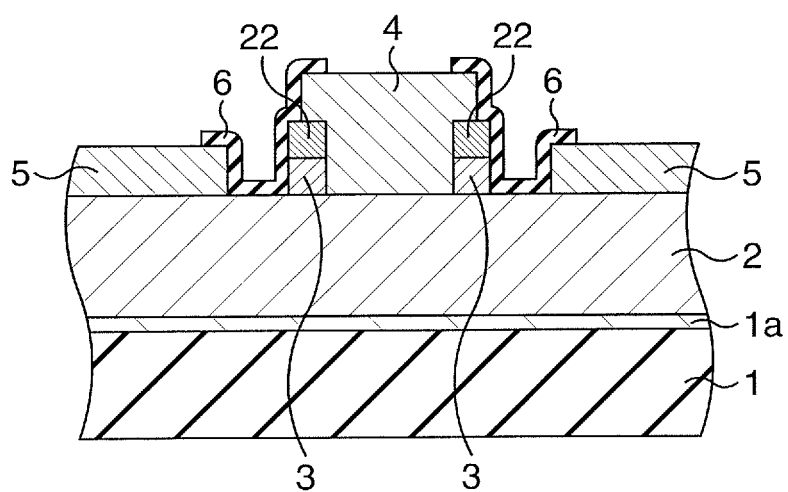
FIG. 7 is a sectional view illustrating a structure of a semiconductor device according to a fourth embodiment.

Next, a fourth embodiment will be described. When the processing of the InGaN layer 3 is performed through dry etching as in the first to third embodiments, it may be difficult to stop the etching at the interface between the InGaN layer 3 and the n-type GaN layer 2. Further, if the InGaN layer 3 is remained, the forward voltage is increased due to the potential barrier, and if the overetching is performed too much, there is a chance that the breakdown easily occurs. Moreover, there exists an in-plane distribution also in the etching rate of the InGaN layer 3 when performing the dry etching. Therefore, even if the overetching is performed, a residue of the InGaN layer 3 may exist, or the overetching may be performed somewhat excessively, resulting in that there is a possibility that an in-plane distribution in diode characteristic is generated. If the in-plane distribution in the diode characteristic is generated, the yield may be sometimes reduced. Further, there is a possibility that an absolute value of breakdown voltage is lowered due to damage when performing the dry etching. In the fourth embodiment, such concerns are cleared up by performing PEC (photo electrochemical) etching, instead of the dry etching. FIG. 7 is a sectional view illustrating a structure of a semiconductor device (Schottky barrier diode) according to the fourth embodiment.

In the fourth embodiment, as illustrated in FIG. 7, a metal film 22 is formed over the InGaN layer 3, the anode electrode 4 has a thickness greater than that of a multi-layered body of the InGaN layer 3 and the metal film 22, and an outer peripheral portion of the anode electrode 4 is brought into contact with an upper surface of the metal film 22. Although details will be described later, the metal film 22 is used as a light-shielding mask when performing the PEC. The other structure is similar to that of the first embodiment.

Also in the fourth embodiment, it is possible to achieve an effect similar to that of the first embodiment. Further, when a Ni film is used as the metal film 22 over the InGaN layer 3, since a work function of Ni is relative high, it is possible to further suppress an electric field concentration in the vicinity of the InGaN layer 3.

Figure 8A:
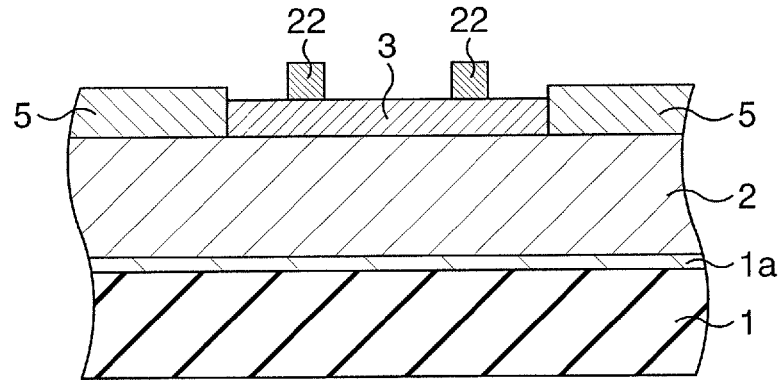
FIG. 8A is a sectional view illustrating a method of manufacturing the semiconductor device according to the fourth embodiment.
Figure 8B:
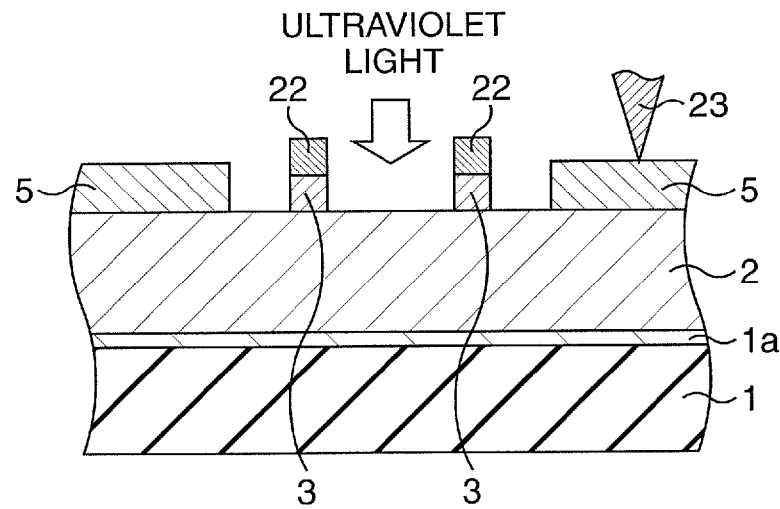
FIG. 8B is a sectional view illustrating the method of manufacturing the semiconductor device, continued from FIG. 8A.
Figure 8C:
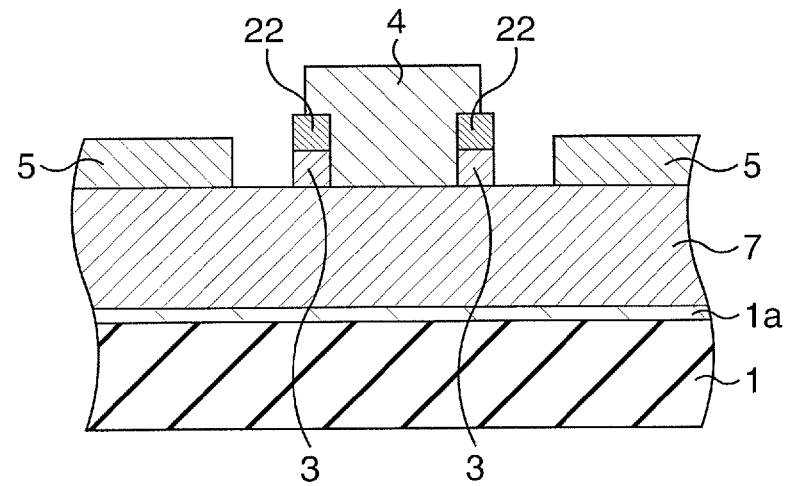
FIG. 8C is a sectional view illustrating the method of manufacturing the semiconductor device, continued from FIG. 8B.

Next, a method of manufacturing the semiconductor device according to the fourth embodiment will be described. FIG. 8A to FIG. 8C are sectional views illustrating the method of manufacturing the semiconductor device according to the fourth embodiment in the order of steps.

First, similar to the first embodiment, processing up to the formation of the cathode electrode 5 is performed (FIG. 4A to FIG. 4D). Then, as illustrated in FIG. 8A, the metal film 22 covering a part of the InGaN layer 3 which is to be remained as a ring-shaped guard ring is formed over the InGaN layer 3. A Ni film having a thickness of about 100 nm is formed as the metal film 22 by a lift-off method, for example. The deposition of the Ni film is performed by a vapor deposition method, for example.

Thereafter, as illustrated in FIG. 8B, the InGaN layer 3 is processed through the photo electrochemical etching (PEC)

with the metal film 22 as the light-shielding mask, to thereby make a front surface of the n-type GaN layer 2 being exposed in a region in which a Schottky junction surface is provided and a region by which the anode electrode 4 and the cathode electrode 5 are isolated. In the PEC, for example, the sapphire substrate 1, the n-type GaN layer 2 formed over the substrate, and the like are immersed in a KOH solution, a Pt electrode is put in the KOH solution, and an electrode 23 is brought into contact with the cathode electrode 5. Further, the Pt electrode is connected to a negative pole of a direct-current power supply, the electrode 23 is connected to a positive pole of the direct-current power supply, and while applying a bias between the cathode electrode 5 and the Pt electrode, ultraviolet light having a wavelength longer than a wavelength (365 nm) of a band gap (3.4 eV) of the n-type GaN layer 2 and shorter than a wavelength (387 nm) of a band gap (3.2 eV) of the InGaN layer 3 is irradiated to the InGaN layer 3. When such ultraviolet light is irradiated to the InGaN layer 3, a hole that contributes to the etching is generated in the InGaN layer 3, resulting in that the etching of the InGaN layer 3 progresses. On the other hand, since no hole is generated in the part covered with the metal film 22, the part is not etched. Further, when the front surface of the n-type GaN layer 2 is exposed, the ultraviolet light is irradiated to the n-type GaN layer 2, but, since the wavelength of the ultraviolet light is longer than the wavelength of the band gap of the n-type GaN layer 2, a hole that contributes to the etching is not generated in the n-type GaN layer 2. Therefore, the n-type GaN layer 2 is not etched. Accordingly, it is possible to securely remove the InGaN layer 3 without performing the overetching.

Subsequently, as illustrated in FIG. 8C, the anode electrode 4 is formed in a similar manner to the first embodiment. The anode electrode 4 is electrically connected to the metal film 22.

Then, similar to the first embodiment, processing subsequent to the formation of the passivation film 6 is performed (FIG. 4I to FIG. 4K). Thus, the structure illustrated in FIG. 7 is obtained.

In the fourth embodiment, since the processing of the InGaN layer 3 is conducted by the PEC, it is possible to clear up the above-described concerns. Specifically, in the fourth embodiment, it is possible to stop the etching at the interface between the InGaN layer 3 and the n-type GaN layer 2, so that even if the in-plane distribution exists also in the etching rate of the InGaN layer 3, it is possible to prevent the side surface of the anode electrode 4 from being brought into contact with the n-type GaN layer 2, while preventing the generation of residue of the InGaN layer 3. Further, when compared to the dry etching, damage is extremely difficult to occur, and an absolute value of breakdown voltage is difficult to be lowered.

Note that when a p-type GaN layer is formed instead of the InGaN layer 3, it is extremely difficult to perform wet etching through the photo electrochemical etching (PEC). This is because the p-type GaN layer functions as an etching stopper against the n-type GaN layer.

Fifth Embodiment

Figure 9:
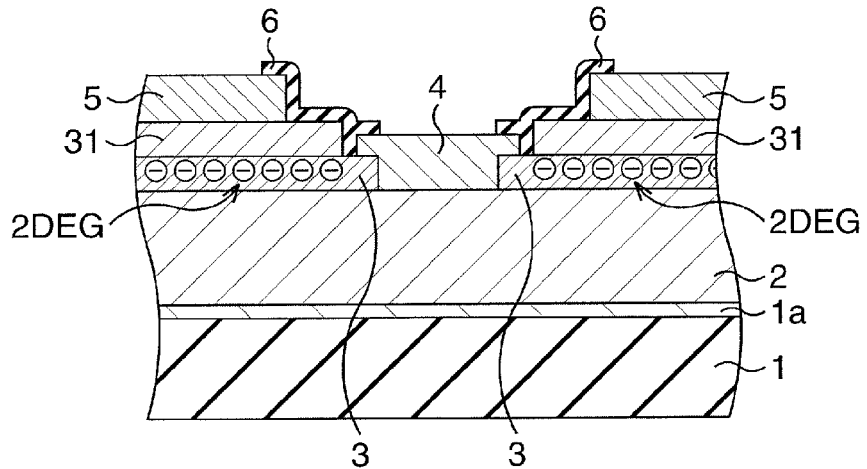
FIG. 9 is a sectional view illustrating a structure of a semiconductor device according to a fifth embodiment.

Next, a fifth embodiment will be described. In the first to fourth embodiments, due to an extent of depletion layer right below the InGaN layer 3, when compared to a case where the InGaN layer 3 is not provided, a sheet resistance is increased, and an on-resistance is increased by an amount corresponding to the increase in the sheet resistance. If a carrier concentration of the n-type GaN layer 2 is increased, it is possible to lower the on-resistance, but, the backward breakdown voltage is lowered. In the fifth embodiment, high backward breakdown voltage and low on-resistance are realized with two-dimensional electron gas (2DEG). FIG. 9 is a sectional view illustrating a structure of a semiconductor device (Schottky barrier diode) according to the fifth embodiment.

In the fifth embodiment, as illustrated in FIG. 9, the InGaN layer 3 is formed so as to be extended to a part below the cathode electrode 5. Further, an AlGaN layer 31 is formed between the InGaN layer 3 and the cathode electrode 5. An Al composition of the AlGaN layer 31 is about 30%. The passivation film 6 also covers the AlGaN layer 31. The other structure is similar to that of the first embodiment.

In the fifth embodiment as described above, high-concentration 2DEG exists in the vicinity of an interface of the InGaN layer 3 with the AlGaN layer 31, as illustrated in FIG. 9. Therefore, it is possible to significantly reduce the sheet resistance compared to the first to fourth embodiments. Accordingly, by setting the carrier concentration of the n-type GaN layer 2 to be lower than those of the first to fourth embodiments, it is possible to further improve the backward breakdown voltage.

Figure 10A:
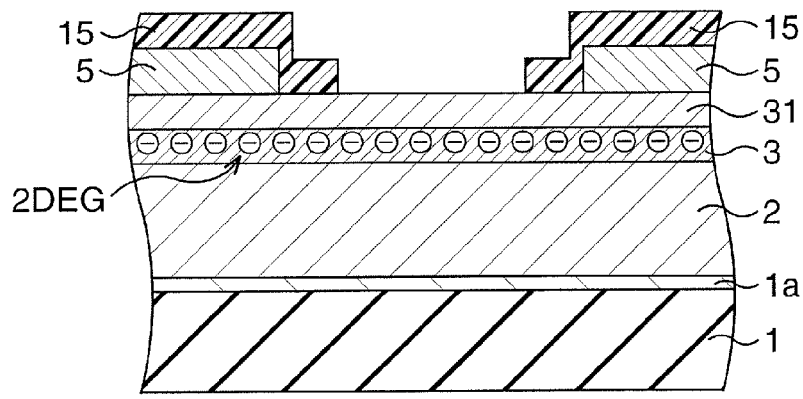
FIG. 10A is a sectional view illustrating a method of manufacturing the semiconductor device according to the fifth embodiment.
Figure 10B:
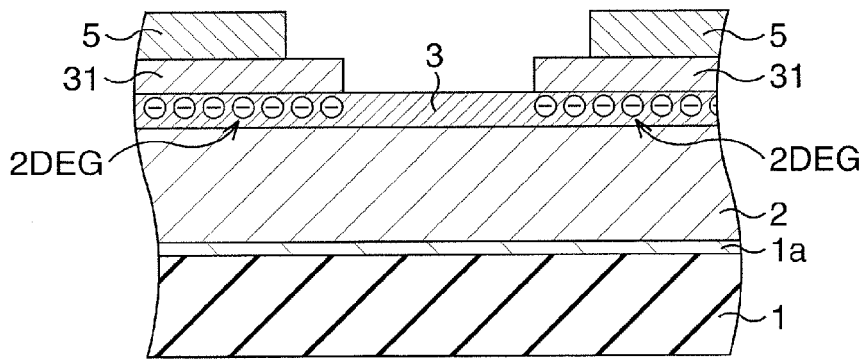
FIG. 10B is a sectional view illustrating the method of manufacturing the semiconductor device, continued from FIG. 10A.
Figure 10C:
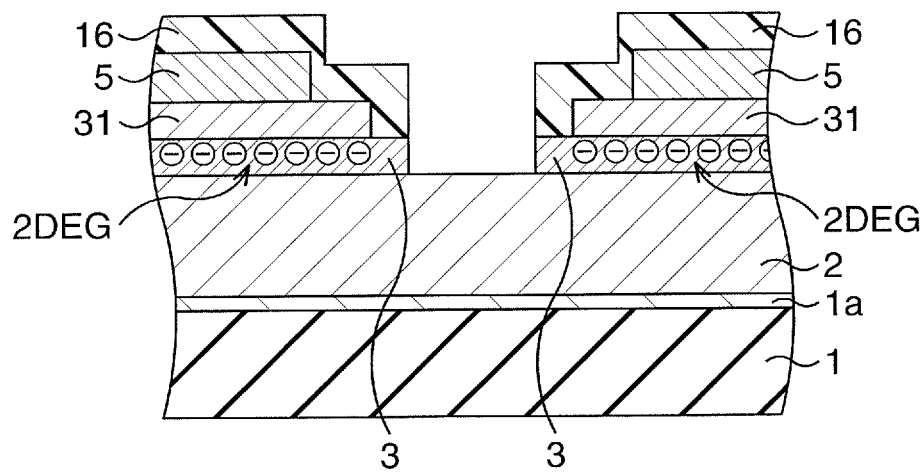
FIG. 10C is a sectional view illustrating the method of manufacturing the semiconductor device, continued from FIG. 10B.

Next, a method of manufacturing the semiconductor device according to the fifth embodiment will be described. FIG. 10A to FIG. 10C are sectional views illustrating the method of manufacturing the semiconductor device according to the fifth embodiment in the order of steps.

First, as illustrated in FIG. 10A, the AlN nucleus formation layer 1a, the n-type GaN layer 2, the InGaN layer 3 and the AlGaN layer 31 are formed over the sapphire substrate 1 by an MOVPE method, for example. For example, a thickness of the n-type GaN layer 2 is set to about 1 µm, and as an n-type impurity, Si of about $1 \times 10^{17}$ cm$^{-3}$ is doped. In other words, the carrier concentration is set to be lower than that of the first embodiment. Further, for example, a thickness of the InGaN layer 3 is set to about 10 nm, and an In composition is set to about 5% to 7%. Further, for example, a thickness of the AlGaN layer 31 is set to about 20 nm, and an Al composition is set to about 30%. For example, a growth temperature of the n-type GaN layer 2 is set to about 1000° C., a growth temperature of the InGaN layer 3 is set to about 780° C., and a growth temperature of the AlGaN layer 31 is set to about 1000° C. Then, the cathode electrode 5 is formed on the AlGaN layer 31 by a lift-off method. Thereafter, a resist pattern 15 covering a part to be remained of the AlGaN layer 31 is formed over the AlGaN layer 31 and the cathode electrode 5. The resist pattern 15 is formed by photolithography.

Subsequently, as illustrated in FIG. 10B, the AlGaN layer 31 is etched with the resist pattern 15 as an etching mask, to thereby make a part of a front surface of the InGaN layer 3 being exposed. An etching rate of the AlGaN layer 31 is set to 10 nm/min, and an etching time is set to 2.5 minutes, for example. Specifically, overetching is performed a little.

Then, as illustrated in FIG. 10C, a resist pattern 16 having an opening at a region in which the anode electrode 4 is to be formed is formed over the InGaN layer 3, the AlGaN layer 31 and the cathode electrode 5. The resist pattern 16 is formed by photolithography. Thereafter, the InGaN layer 3 is etched with the resist pattern 16 as an etching mask, to thereby make a front surface of the n-type GaN layer 2 being exposed in the region in which the anode electrode 4 is to be formed. Subsequently, the resist pattern 16 is removed, and similar to the first embodiment, processing subsequent to the formation of the anode electrode 4 by a lift-off method is performed. Thus, the structure illustrated in FIG. 9 is obtained.

Sixth Embodiment

Figure 11:
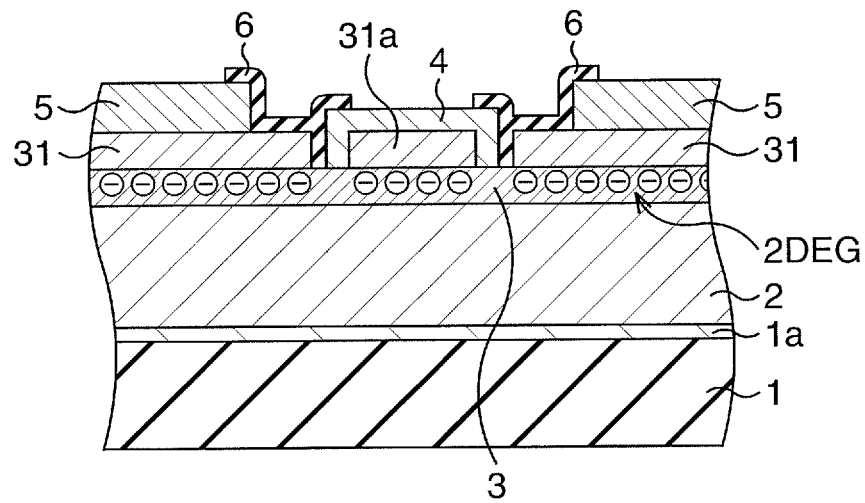
FIG. 11 is a sectional view illustrating a structure of a semiconductor device according to a sixth embodiment.

Next, a sixth embodiment will be described. FIG. 11 is a sectional view illustrating a structure of a semiconductor device (Schottky barrier diode) according to the sixth embodiment.

In the sixth embodiment, as illustrated in FIG. 11, the InGaN layer 3 remains also below the anode electrode 4, and an AlGaN layer 31a is formed on the inside of the AlGaN layer 31 apart from the AlGaN layer 31. The AlGaN layer 31a has a thickness and an Al composition similar to those of the AlGaN layer 31. Further, the anode electrode 4 is formed so as to cover the AlGaN layer 31a from above and sides of the AlGaN layer 31a. The other structure is similar to that of the fifth embodiment.

Also in the sixth embodiment, it is possible to achieve an effect similar to that of the fifth embodiment. Further, since there is no need to perform etching on the InGaN layer 3, it is possible to simplify the manufacturing process.

Note that in the fifth and sixth embodiments, even if an InAlN layer, an InAlGaN layer or the like is used instead of the AlGaN layer 31, it is also possible to achieve the similar effect by making 2DEG to be generated.

Seventh Embodiment

Figure 12:
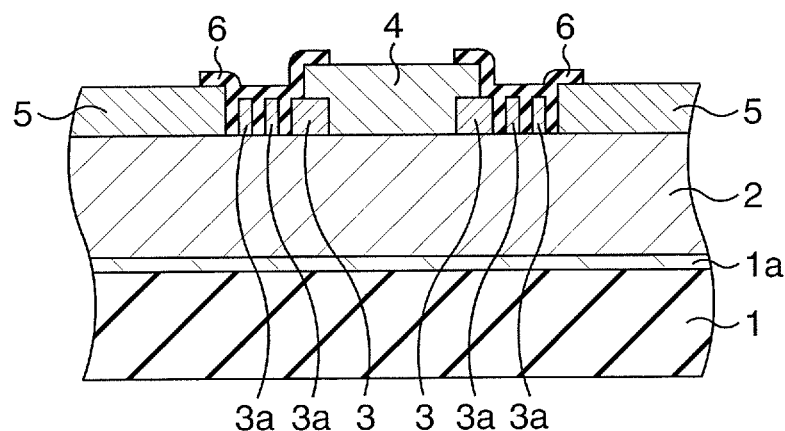
FIG. 12 is a sectional view illustrating a structure of a semiconductor device according to a seventh embodiment.

Next, a seventh embodiment will be described. FIG. 12 is a sectional view illustrating a structure of a semiconductor device (Schottky barrier diode) according to the seventh embodiment.

In the seventh embodiment, as illustrated in FIG. 12, one or more ring-shaped InGaN layers 3a are formed between the InGaN layer 3 and the cathode electrode 5. The InGaN layer 3a has a thickness and an In composition similar to those of the InGaN layer 3. The passivation film 6 also covers the InGaN layer 3a. The other structure is similar to that of the first embodiment.

Also in the seventh embodiment as described above, it is possible to achieve an effect similar to that of the first embodiment. Further, since the one or more ring-shaped InGaN layers 3a are formed, namely, a multiple guard ring structure is employed, it is possible to obtain a higher backward breakdown voltage.

Figure 13A:
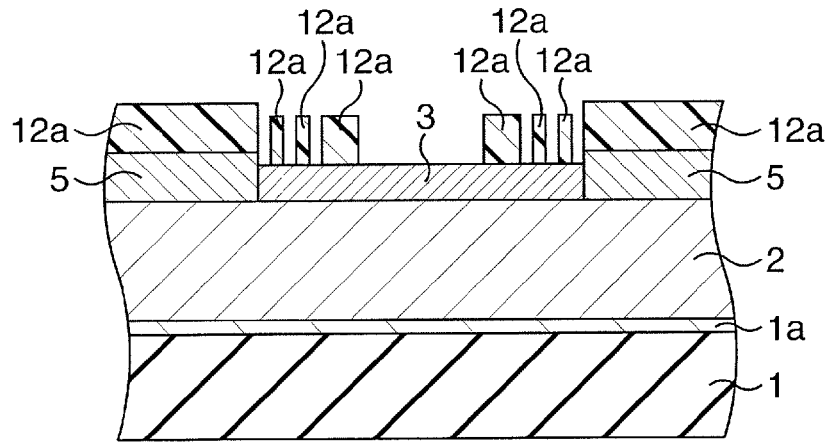
FIG. 13A is a sectional view illustrating a method of manufacturing the semiconductor device according to the seventh embodiment.
Figure 13B:
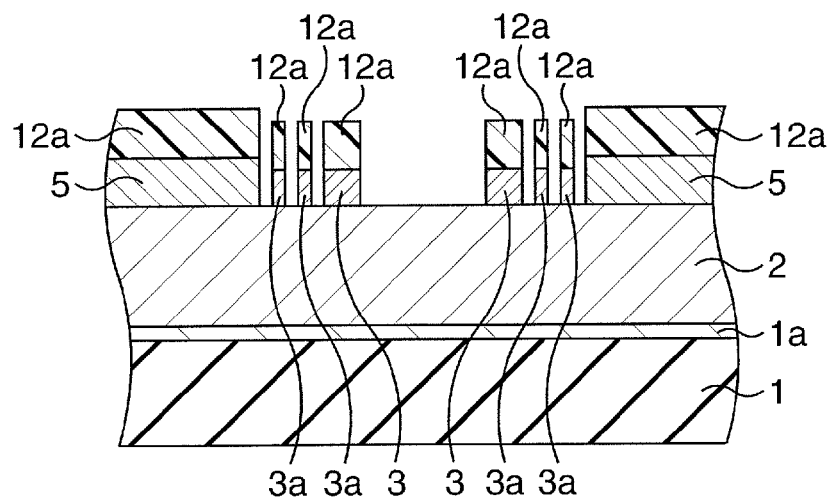
FIG. 13B is a sectional view illustrating the method of manufacturing the semiconductor device, continued from FIG. 13A.
Figure 13C:
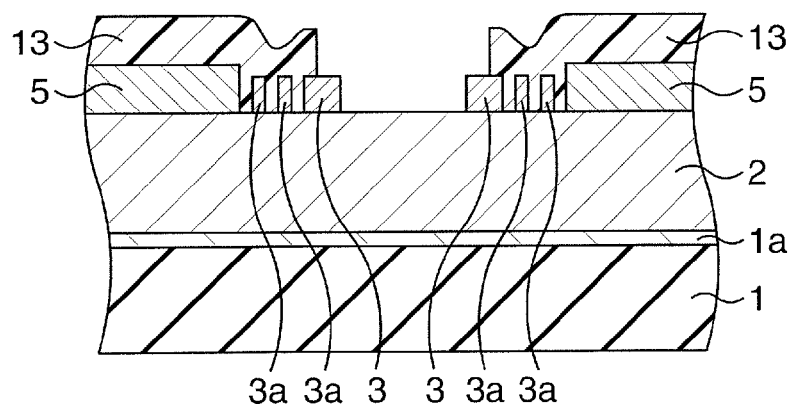
FIG. 13C is a sectional view illustrating the method of manufacturing the semiconductor device, continued from FIG. 13B.

Next, a method of manufacturing the semiconductor device according to the seventh embodiment will be described. FIG. 13A to FIG. 13C are sectional views illustrating the method of manufacturing the semiconductor device according to the seventh embodiment in the order of steps.

First, similar to the first embodiment, processing up to the formation of the cathode electrode 5 is performed (FIG. 4A to FIG. 4D). Then, as illustrated in FIG. 13A, a resist pattern 12a covering the cathode electrode 5 and covering parts of the InGaN layer 3 which are to be remained as ring-shaped multiple guard rings is formed. The resist pattern 12a is formed by photolithography.

Then, as illustrated in FIG. 13B, the InGaN layer 3 is etched with the resist pattern 12a as an etching mask, to thereby make a front surface of the n-type GaN layer 2 being exposed in a region in which a Schottky junction surface is provided and a region by which the anode electrode 4 and the cathode electrode 5 are isolated. At this time, the front surface of the n-type GaN layer 2 is exposed in ring shapes in the region by which the anode electrode 4 and the cathode electrode 5 are isolated.

Thereafter, as illustrated in FIG. 13C, the resist pattern 12a is removed, and a resist pattern 13 having an opening at a region in which the anode electrode 4 is to be formed is formed, similar to the first embodiment.

Subsequently, similar to the first embodiment, processing subsequent to the formation of the anode electrode 4 is performed (FIG. 4H to FIG. 4K). Thus, the structure illustrated in FIG. 12 is obtained.

Eighth Embodiment

Figure 14:
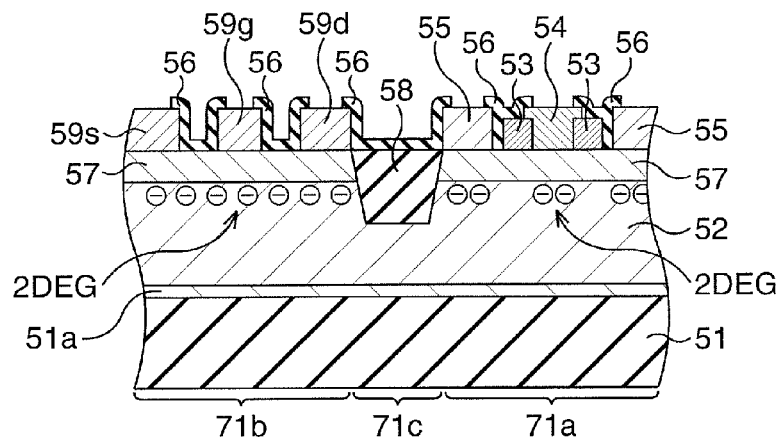
FIG. 14 is a sectional view illustrating a structure of a semiconductor device according to an eighth embodiment.

Next, an eighth embodiment will be described. In the eighth embodiment, a GaN-based SBD and a high electron mobility transistor (HEMT) are provided on the same substrate. FIG. 14 is a sectional view illustrating a structure of a semiconductor device according to the eighth embodiment.

In the eighth embodiment, as illustrated in FIG. 14, an SBD region 71a and a HEMT region 71b sandwiching an element isolation region 71c are provided. An AlN nucleus formation layer 51a is formed over a sapphire substrate 51, a GaN layer 52 is formed over the AlN nucleus formation layer 51a, and an n-type AlGaN layer 57 is formed over the GaN layer 52, in each of the SBD region 71a, the HEMT region 71b and the element isolation region 71c. An intentional doping of impurity into the GaN layer 52 is not conducted. A front surface of the GaN layer 52 over the AlN nucleus formation layer 51a has a Ga face. An element isolation part 58 is formed in the n-type AlGaN layer 57 and a surface portion of the GaN layer 52 in the element isolation region 71c. Therefore, although two-dimensional electron gas (2DEG) is induced in the vicinity of the interface of the GaN layer 52 with the n-type AlGaN layer 57 in the SBD region 71a and the HEMT region 71b, no 2DEG exists in the element isolation region 71c. The element isolation part 58 may be formed through a doping of boron ions or the like, a mesa formation, or the like.

A ring-shaped InGaN layer 53 is formed over the n-type AlGaN layer 57 as a guard ring in the SBD region 71a. Further, an anode electrode (Schottky electrode) 54 that forms a Schottky junction with the n-type AlGaN layer 57 is formed on the inside of the InGaN layer 53. The anode electrode 54 has a thickness greater than that of the InGaN layer 53, and an outer peripheral portion of the anode electrode 54 is brought into contact with an upper surface of the InGaN layer 53. Further, a cathode electrode (ohmic electrode) 55 that forms an ohmic junction with the n-type AlGaN layer 57 is formed at a position apart from the InGaN layer 53. Further, a passivation film 56 covering the n-type AlGaN layer 57 and the InGaN layer 53 is formed between the anode electrode 54 and the cathode electrode 55. The passivation film 56 also covers, from above, a part of the anode electrode 54 and a part of the cathode electrode 55. Note that no 2DEG exists at a position below the InGaN layer 53.

A gate electrode 59g is formed over the n-type AlGaN layer 57 in the HEMT region 71b. Further, a source electrode 59s and a drain electrode 59d are also formed over the n-type AlGaN layer 57 so as to sandwich the gate electrode 59g in a plan view. Further, the passivation film 56 covers the n-type AlGaN layer 57 between the gate electrode 59g and the source electrode 59s and between the gate electrode 59g and the drain electrode 59d. The passivation film 56 also covers, from above, a part of the gate electrode 59g, a part of the source electrode 59s and a part of the drain electrode 59d. The n-type AlGaN layer 57 functions as an electron supply layer, and the GaN layer 52 functions as an electron transit layer.

According to the eighth embodiment as described above, it is possible to realize an integration of GaN-based SBD and HEMT.

Next, a method of manufacturing the semiconductor device according to the eighth embodiment will be described. FIG. 15A to FIG. 15E are sectional views illustrating the method of manufacturing the semiconductor device according to the eighth embodiment in the order of steps.

Figure 15A:
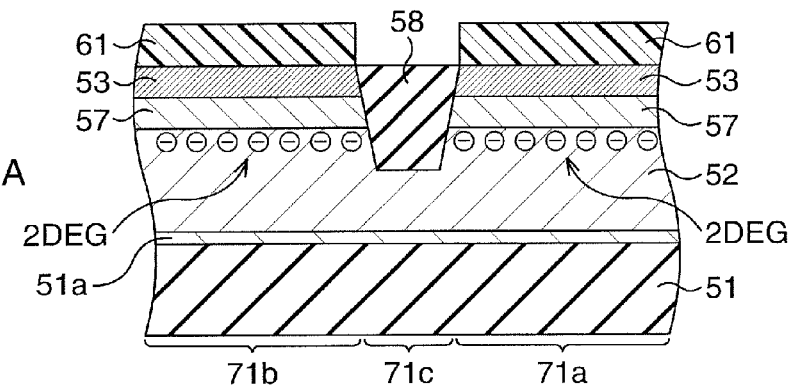
FIG. 15A is a sectional view illustrating a method of manufacturing the semiconductor device according to the eighth embodiment.

First, as illustrated in FIG. 15A, the AlN nucleus formation layer 51a, the GaN layer 52, the n-type AlGaN layer 57 and the InGaN layer 53 are formed over the sapphire substrate 51 by an MOVPE method, for example. Since the AlN nucleus formation layer 51a is formed over the sapphire substrate 51 before forming the GaN layer 52, a front surface in a growth direction of the GaN layer 52 has a Ga face. Further, for example, a thickness of the GaN layer 52 is set to about 2 μm. For example, a thickness of the n-type AlGaN layer 57 is set to 20 nm, and as an n-type impurity, Si of about $1\times10^{18}$ cm$^{-3}$ is doped. For example, a thickness of the InGaN layer 53 is set to about 20 nm, and an In composition is set to about 5% to 7%.

Then, a resist pattern 61 covering the SBD region 71a and the HEMT region 71b and having an opening at the element isolation region 71c is formed over the InGaN layer 53. The resist pattern 61 is formed by photolithography. Thereafter, boron ions are injected into the InGaN layer 53, the n-type AlGaN layer 57, and the surface portion of the GaN layer 52, to thereby form the element isolation part 58. The element isolation part 58 may be formed through a mesa formation or the like.

Figure 15B:
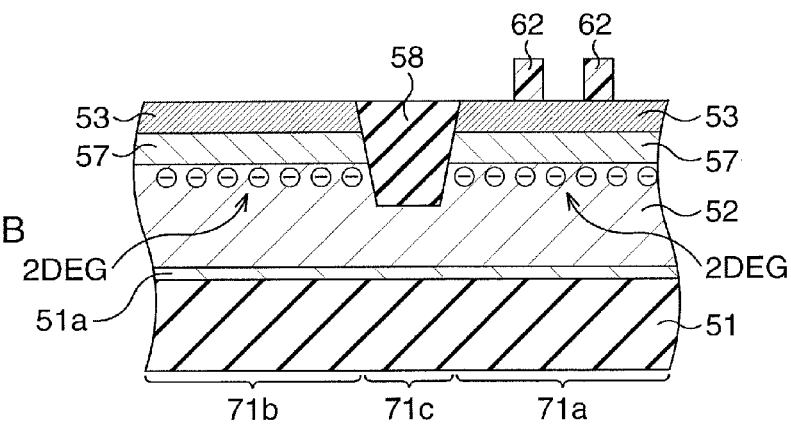
FIG. 15B is a sectional view illustrating the method of manufacturing the semiconductor device, continued from FIG. 15A.

Subsequently, as illustrated in FIG. 15B, the resist pattern 61 is removed, and a resist pattern 62 covering a part of the InGaN layer 53 which is to be remained as a ring-shaped guard ring is formed. The resist pattern 62 is formed by photolithography.

Figure 15C:
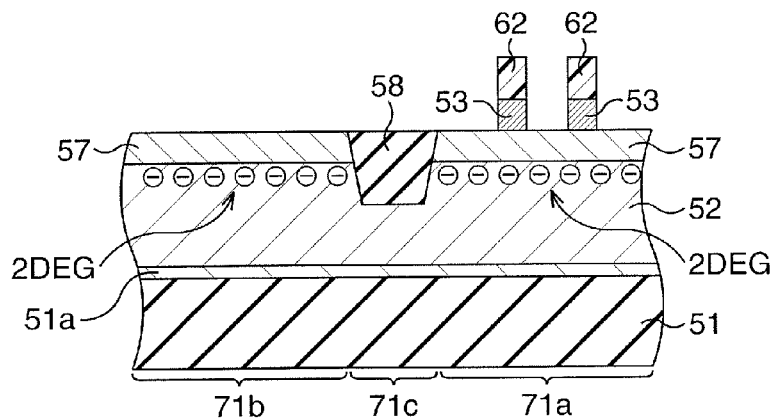
FIG. 15C is a sectional view illustrating the method of manufacturing the semiconductor device, continued from FIG. 15B.

Then, as illustrated in FIG. 15C, the InGaN layer 53 is etched with the resist pattern 62 as an etching mask. As a result, the InGaN layer 53 disappears in the HEMT region 71b and the element isolation region 71c. Note that as the etching of the InGaN layer 53, dry etching using chlorine gas, for example, is performed. An etching rate of the InGaN layer 53 is set to 10 nm/min, for example.

Figure 15D:
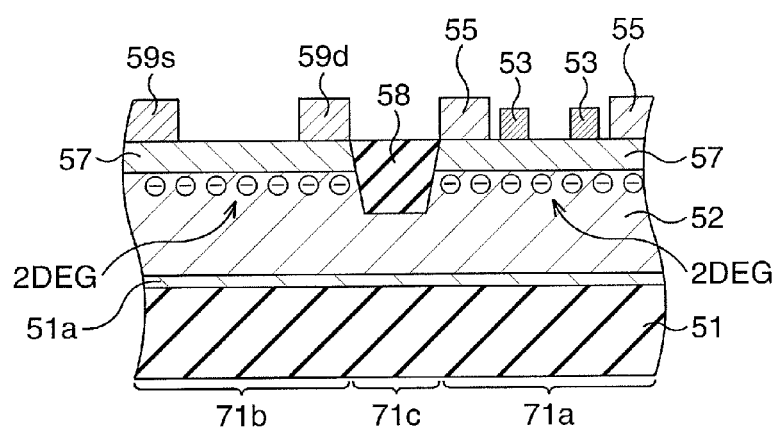
FIG. 15D is a sectional view illustrating the method of manufacturing the semiconductor device, continued from FIG. 15C.

Thereafter, as illustrated in FIG. 15D, the resist pattern 62 is removed, and the cathode electrode 55, the source electrode 59s and the drain electrode 59d are formed over the n-type AlGaN layer 57 by a lift-off method, for example. A multi-layered body of a Ti film having a thickness of about 30 nm and an Al film over the Ti film having a thickness of about 300 nm is formed, for example, as each of the cathode electrode 55, the source electrode 59s and the drain electrode 59d. The deposition of the Ti film and the Al film is performed by a vapor deposition method, for example. Subsequently, the RTA is conducted at about 600° C.

Figure 15E:
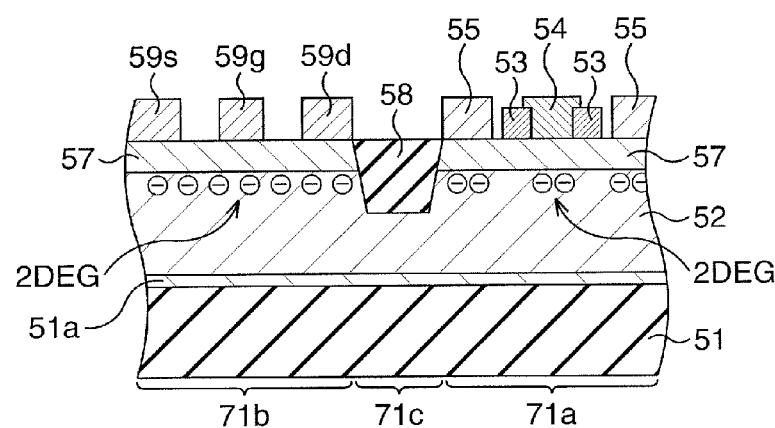
FIG. 15E is a sectional view illustrating the method of manufacturing the semiconductor device, continued from FIG. 15D.

Then, as illustrated in FIG. 15E, the anode electrode 54 and the gate electrode 59g are formed by a lift-off method, for example. As a result, 2DEG disappears at a position below the InGaN layer 53. A multi-layered body of a Ni film having a thickness of about 100 nm and an Au film over the Ni film having a thickness of about 300 nm is formed, for example, as each of the anode electrode 54 and the gate electrode 59g. The deposition of the Ni film and the Au film is performed by a vapor deposition method, for example.

Thereafter, the passivation film 56 is formed in a similar manner to forming the passivation film 6 in the first embodiment. Thus, the structure illustrated in FIG. 14 is obtained.

Ninth Embodiment

Figure 16A:
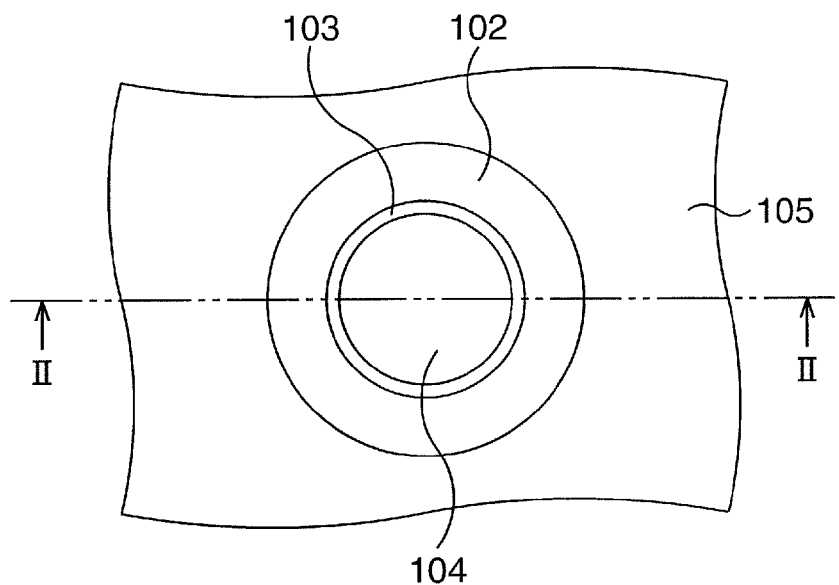
FIG. 16A is a plan view illustrating a structure of a semiconductor device according to a ninth embodiment.

Next, a ninth embodiment will be described. FIG. 16A is a plan view illustrating a structure of a semiconductor device (Schottky barrier diode) according to the ninth embodiment, and FIG. 16B is a sectional view taken along a line II-II in FIG. 16A.

Figure 16B:
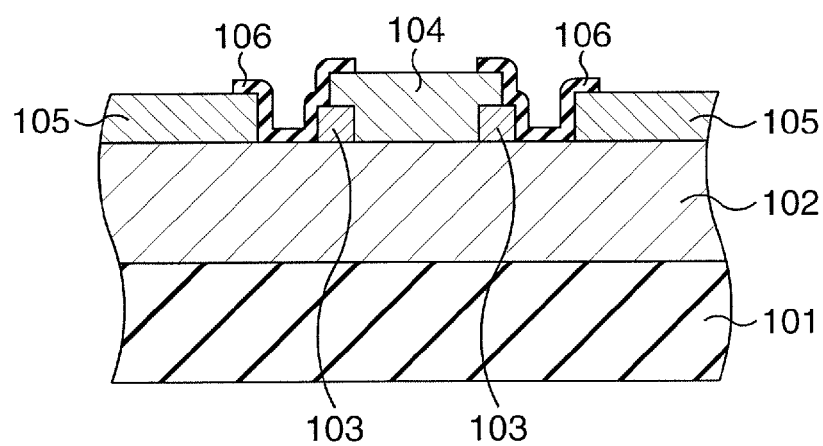
FIG. 16B is a sectional view taken along a line in FIG. 16A.

In the ninth embodiment, as illustrated in FIG. 16A and FIG. 16B, an n-type GaN layer 102 is formed over a sapphire substrate 101. A front surface of the n-type GaN layer 102 has an N face ((000-1) plane according to Miller index notation). A ring-shaped AlGaN layer 103 is formed as a guard ring over the n-type GaN layer 102. Further, an anode electrode (Schottky electrode) 104 that forms a Schottky junction with the n-type GaN layer 102 is formed on the inside of the AlGaN layer 103. The anode electrode 104 has a thickness greater than that of the AlGaN layer 103, and an outer peripheral portion of the anode electrode 104 is brought into contact with an upper surface of the AlGaN layer 103. Further, a cathode electrode (ohmic electrode) 105 that forms an ohmic junction with the n-type GaN layer 102 is formed at a position apart from the AlGaN layer 103. Further, a passivation film 106 covering the n-type GaN layer 102 and the AlGaN layer 103 is formed between the anode electrode 104 and the cathode electrode 105. The passivation film 106 also covers, from above, a part of the anode electrode 104 and a part of the cathode electrode 105. Note that the passivation film 106 is omitted in FIG. 16A.

Figure 17:
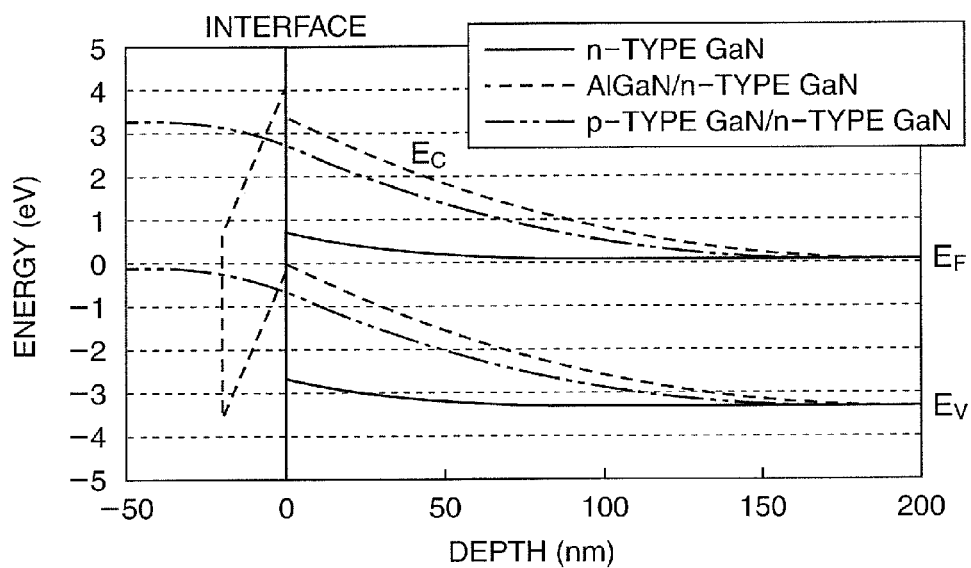
FIG. 17 is a diagram illustrating a change in band potentials.

Here, explanation will be made on an function of the AlGaN layer 103. FIG. 17 is a diagram illustrating a result of simulation regarding a change in band potentials. FIG. 17 illustrates respective band potentials of a structure formed only of an n-type GaN layer whose front surface has a Ga face (solid line), a structure formed of an n-type GaN layer whose front surface has an N face and an AlGaN layer formed over the n-type GaN layer (dashed line), and a structure formed of an n-type GaN layer whose front surface has a Ga face and a p-type GaN layer formed over the n-type GaN layer (two-dot chain line). Note that a concentration of activated n-type impurity in the n-type GaN layer was set to $5\times10^{17}$ cm$^{-3}$. An Al composition of the AlGaN layer was set to 30%, and a thickness of the layer was set to 20 nm. A concentration of activated p-type impurity in the p-type GaN layer was set to $5\times10^{17}$ cm$^{-3}$, and a thickness of the layer was set to 200 nm. A horizontal axis in FIG. 17 indicates a depth of the n-type GaN layer from the front surface, and a negative value indicates a distance from an interface between the n-type GaN layer and the AlGaN layer or the p-type GaN layer (depth: 0 nm) to a position in the AlGaN layer or the p-type GaN layer.

As illustrated in FIG. 17, the band potential at the interface between the n-type GaN layer and the p-type GaN layer in the structure formed of the n-type GaN layer and the p-type GaN layer (two-dot chain line) is higher than that of the structure formed only of the n-type GaN layer (solid line). Because of such an effect, a backward breakdown voltage is improved in a prior structure provided with a p-type GaN layer.

In like manner, the band potential at the interface between the n-type GaN layer and the AlGaN layer in the structure formed of the n-type GaN layer and the AlGaN layer (dashed line) is also higher than that of the structure formed only of the n-type GaN layer (solid line). This is because, the band potential at the interface between the AlGaN layer grown on the N face in a c-axis direction and the n-type GaN layer is increased by a negative fixed charge because of spontaneous polarization and piezoelectric polarization. Therefore, the backward breakdown voltage is improved, similar to the case of the structure formed of the n-type GaN layer and the p-type GaN layer. Further, when compared to the first embodiment, the band gap of AlGaN is greater than the band gap of InGaN, so that impact ionization is difficult to take place.

Figure 18:
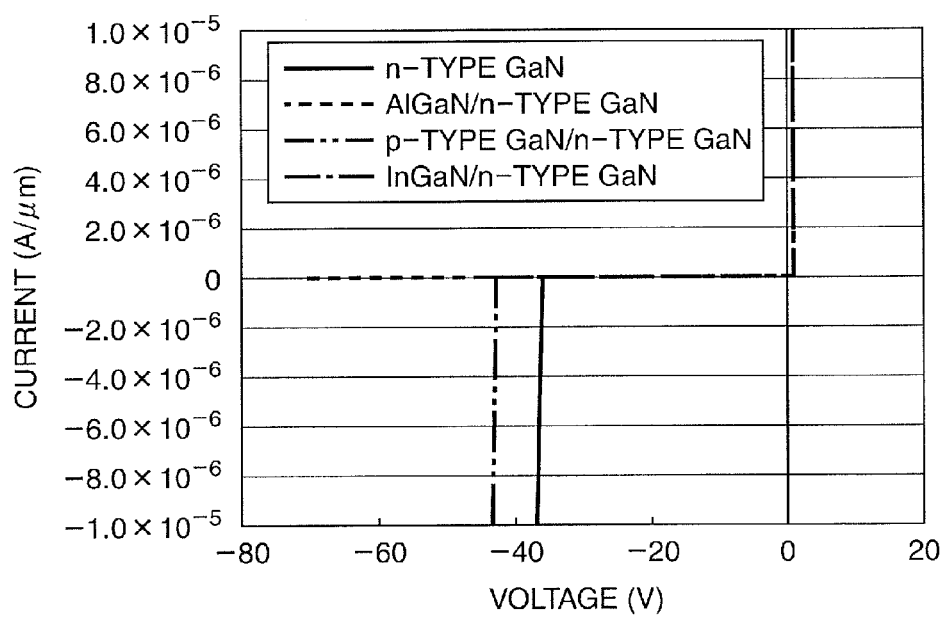
FIG. 18 is a diagram illustrating a change in current-voltage characteristics.

FIG. 18 is a diagram illustrating a result of simulation regarding a change in current-voltage characteristics. FIG. 18 illustrates, in addition to the results illustrated in FIG. 3, a current-voltage characteristic of a structure formed of an n-type GaN layer whose front surface has an N face and an AlGaN layer formed over the n-type GaN layer (dotted line). Note that an Al composition was set to 25%, a thickness of the AlGaN layer was set to 20 nm, and a negative fixed charge of $-1.39\times10^{13}$ cm$^{-2}$ was set to exist in the vicinity of an interface of the AlGaN layer with the n-type GaN layer, in the structure formed of the n-type GaN layer and the AlGaN layer (dotted line).

As illustrated in FIG. 18, an absolute value of the backward breakdown voltage of the structure formed of the n-type GaN layer and the AlGaN layer (dotted line) is 70 V or greater, which can be estimated to be at least higher than that of the backward breakdown voltage of the structure formed of the n-type GaN layer and the p-type GaN layer (two-dot chain line), and higher than that of the backward breakdown voltage of the structure formed of the n-type GaN layer and the InGaN layer (dashed line).

As is apparent from the results of these simulations, according to the ninth embodiment, it is possible to obtain a backward breakdown voltage higher than that of the GaN-based SBD in which the AlGaN layer 103 does not exist and the GaN-based SBD in which the p-type GaN layer is used as a guard ring.

Next, a method of manufacturing the semiconductor device according to the ninth embodiment will be described. FIG. 19A to FIG. 19K are sectional views illustrating the method of manufacturing the semiconductor device according to the ninth embodiment in the order of steps.

Figure 19A:
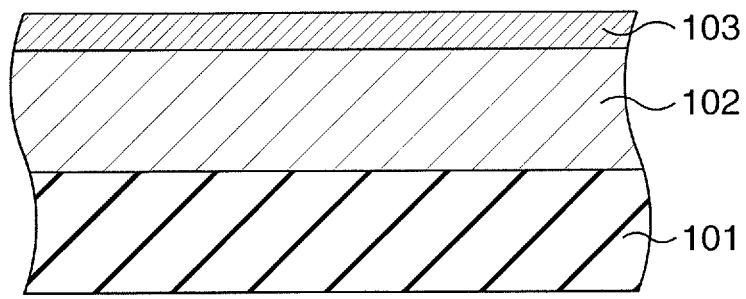
FIG. 19A is a sectional view illustrating a method of manufacturing the semiconductor device according to the ninth embodiment.

First, as illustrated in FIG. 19A, the n-type GaN layer 102 and the AlGaN layer 103 are formed over the sapphire substrate 101 by a plasma assist molecular beam epitaxy (PAMBE) method, for example. Since the n-type GaN layer 102 is formed directly on the sapphire substrate 101, a front surface in a growth direction of the n-type GaN layer 102 has an N face. For example, a thickness of the n-type GaN layer 102 is set to about 1 μm, and as an n-type impurity, Si of about $1 \times 10^{17}$ cm$^{-3}$ is doped. For example, a thickness of the AlGaN layer 103 is set to about 20 nm, and an Al composition is set to about 25% to 30%. For example, a growth temperature of these layers is set to about 720° C.

Figure 19B:
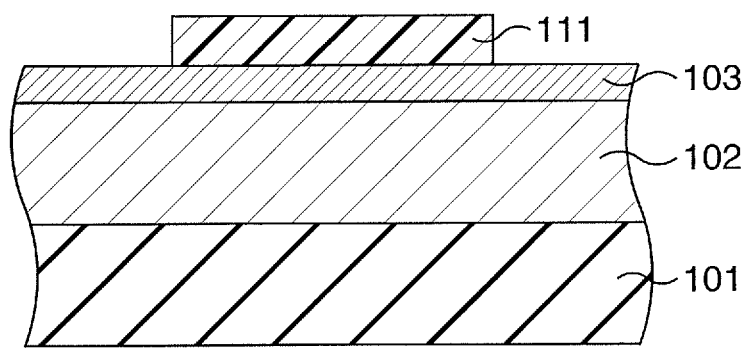
FIG. 19B is a sectional view illustrating the method of manufacturing the semiconductor device, continued from FIG. 19A.

Then, as illustrated in FIG. 19B, a resist pattern 111 having an opening at a region in which the cathode electrode 105 is to be formed is formed over the AlGaN layer 103. The resist pattern 111 is formed by photolithography.

Figure 19C:
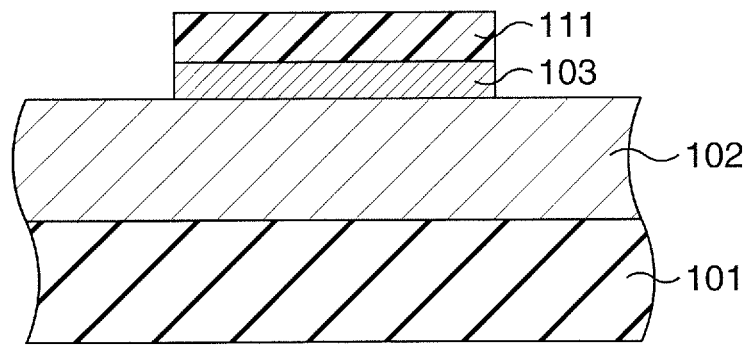
FIG. 19C is a sectional view illustrating the method of manufacturing the semiconductor device, continued from FIG. 19B.

Thereafter, as illustrated in FIG. 19C, the AlGaN layer 103 is etched with the resist pattern 111 as an etching mask, to thereby make a front surface of the n-type GaN layer 102 being exposed in the region in which the cathode electrode 105 is to be formed. As the etching of the AlGaN layer 103, dry etching using chlorine gas, for example, is performed. An etching rate of the AlGaN layer 103 is set to 10 nm/min, for example. In this etching, it is preferable to perform overetching. This is because, if the AlGaN layer 103 remains on the region in which the cathode electrode 105 is to be formed, there is a chance that an ohmic failure occurs due to a potential barrier.

Figure 19D:
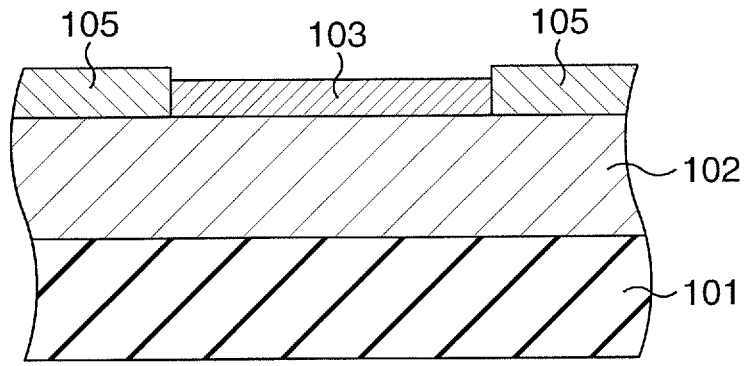
FIG. 19D is a sectional view illustrating the method of manufacturing the semiconductor device, continued from FIG. 19C.

Subsequently, as illustrated in FIG. 19D, the resist pattern 111 is removed, and the cathode electrode 105 is formed over the n-type GaN layer 102 by a lift-off method, for example, in a similar manner to forming the cathode electrode 5 in the first embodiment. Then, the RTA is performed at about 600° C.

Figure 19E:
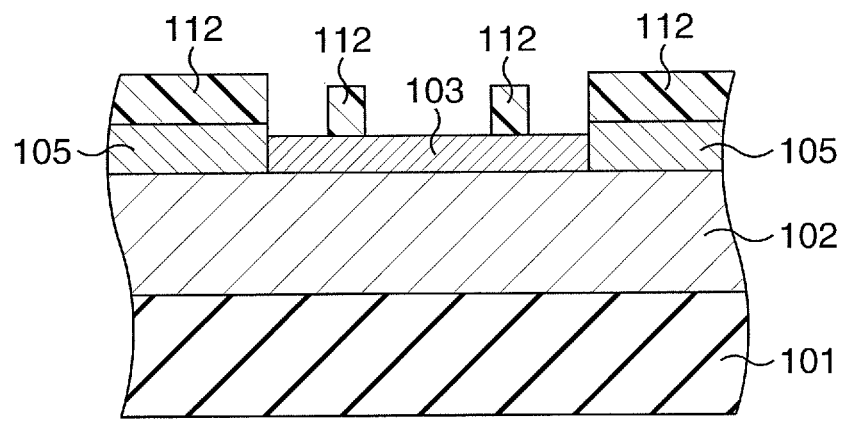
FIG. 19E is a sectional view illustrating the method of manufacturing the semiconductor device, continued from FIG. 19D.

Thereafter, as illustrated in FIG. 19E, a resist pattern 112 covering the cathode electrode 105 and covering a part of the AlGaN layer 103 which is to be remained as a ring-shaped guard ring is formed. The resist pattern 112 is formed by photolithography.

Figure 19F:
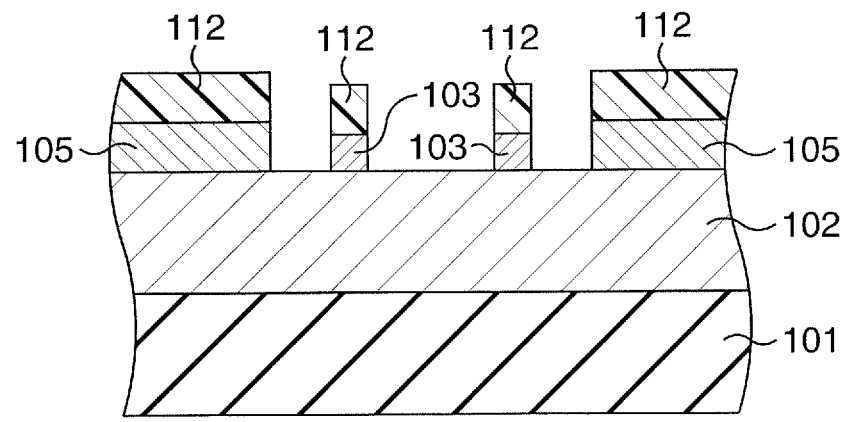
FIG. 19F is a sectional view illustrating the method of manufacturing the semiconductor device, continued from FIG. 19E.

Subsequently, as illustrated in FIG. 19F, the AlGaN layer 103 is etched with the resist pattern 112 as an etching mask, to thereby make a front surface of the n-type GaN layer 102 being exposed in a region in which a Schottky junction surface is provided and a region by which the anode electrode 104 and the cathode electrode 105 are isolated. As the etching of the AlGaN layer 103, dry etching using chlorine gas, for example, is performed. An etching rate of the AlGaN layer 103 is set to 10 nm/min, for example. Also in this etching, it is preferable to perform overetching. This is because, if the AlGaN layer 103 remains on the region in which the Schottky junction surface is provided, there is a chance that a forward voltage is increased due to a potential barrier.

Figure 19G:
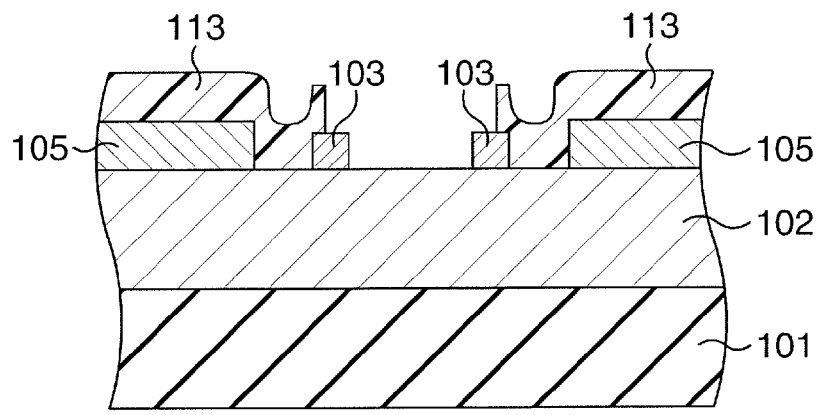
FIG. 19G is a sectional view illustrating the method of manufacturing the semiconductor device, continued from FIG. 19F.

Then, as illustrated in FIG. 19G, the resist pattern 112 is removed, and a resist pattern 113 having an opening at a region in which the anode electrode 104 is to be formed is formed. The resist pattern 113 is formed by photolithography. At this time, it is set that an opening of the resist pattern 113 overlaps a part of the AlGaN layer 103.

Figure 19H:
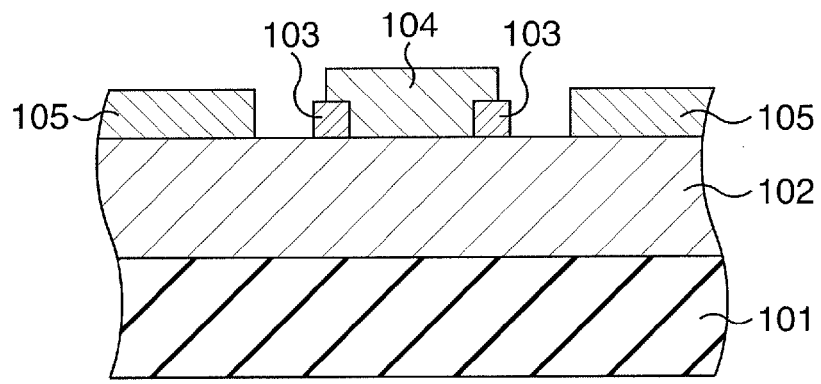
FIG. 19H is a sectional view illustrating the method of manufacturing the semiconductor device, continued from FIG. 19G.

Thereafter, as illustrated in FIG. 19H, the anode electrode 104 is formed by a lift-off method with the resist pattern 113 as a deposition mask, in a similar manner to forming the anode electrode 4 in the first embodiment.

Figure 19I:
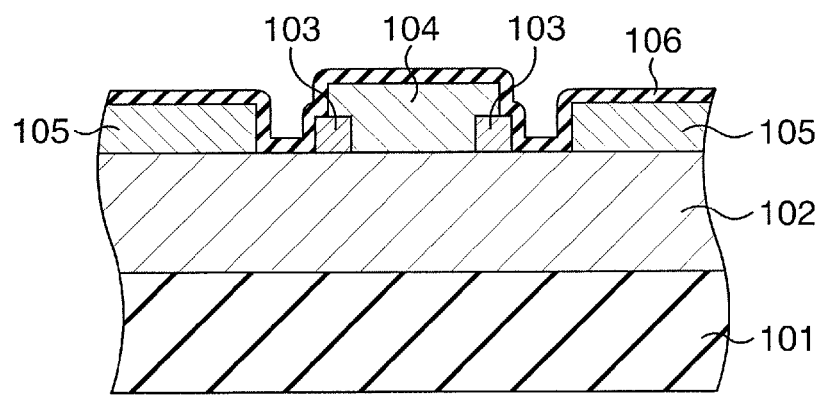
FIG. 19I is a sectional view illustrating the method of manufacturing the semiconductor device, continued from FIG. 19H.

Subsequently, as illustrated in FIG. 19I, the passivation film 106 covering the n-type GaN layer 102, the AlGaN layer 103, the anode electrode 104, and the cathode electrode 105 is formed, in a similar manner to forming the passivation film 6 in the first embodiment.

Figure 19J:
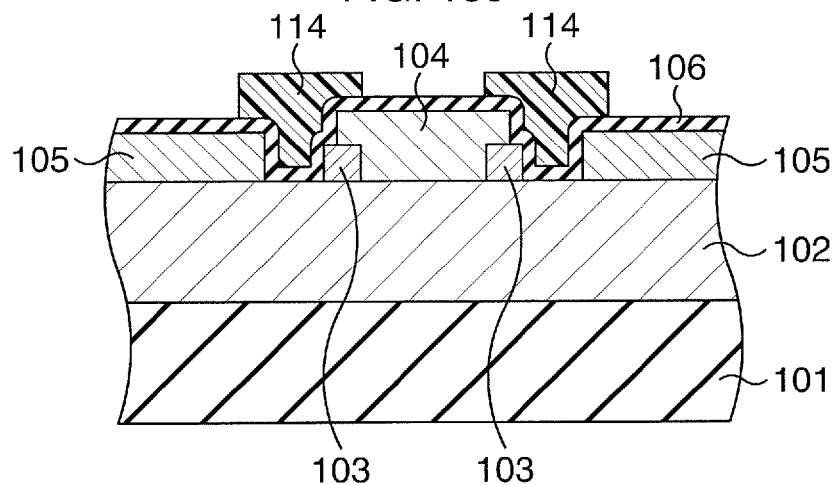
FIG. 19J is a sectional view illustrating the method of manufacturing the semiconductor device, continued from FIG. 19I.

Then, as illustrated in FIG. 19J, a resist pattern 114 having openings at a region in which a contact portion of the anode electrode 104 is to be formed and a region in which a contact portion of the cathode electrode 105 is to be formed is formed over the passivation film 106. The resist pattern 114 is formed by photolithography.

Figure 19K:
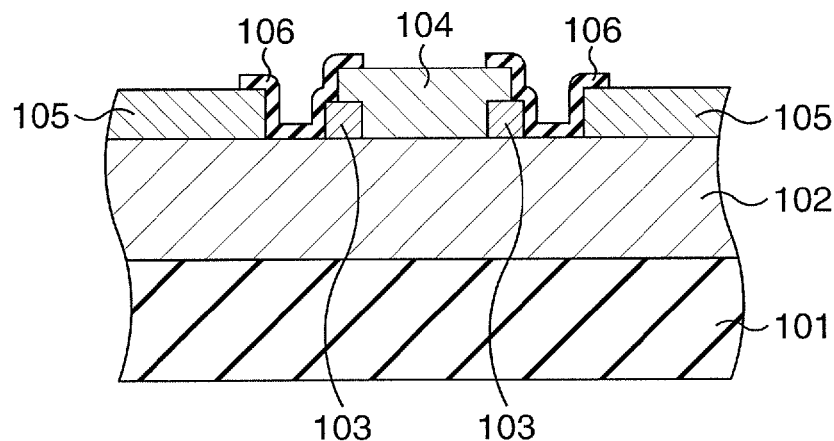
FIG. 19K is a sectional view illustrating the method of manufacturing the semiconductor device, continued from FIG. 19J.

Thereafter, as illustrated in FIG. 19K, the passivation film 106 is etched in a similar manner to etching the passivation film 6 in the first embodiment, to thereby make a part of the anode electrode 104 and a part of the cathode electrode 105 being exposed as the contact portions. Subsequently, the resist pattern 114 is removed.

Thus, the semiconductor device according to the ninth embodiment may be manufactured.

As described above, also in the ninth embodiment, there is no need to form a p-type GaN layer containing a large amount of Mg. Therefore, it is possible to improve a backward breakdown voltage while avoiding a decrease in crystallinity and a roughness of Schottky surface caused by dry etching.

Note that a GaN substrate whose front surface has an N face or an SiC substrate whose front surface has a C (carbon) surface may be used instead of the sapphire substrate 1. Specifically, various types of substrates may be used as long as a GaN layer whose front surface has an N face can be grown on each of the substrates, by taking the growing surface described in the first embodiment into consideration. For example, an AlN substrate, an Si substrate and the like may also be employed. Further, it is also acceptable that a semiconductor layer whose front surface has a Ga face is grown on a substrate, the semiconductor layer is then peeled off from the substrate, and front and rear sides of the semiconductor layer are reversed, to thereby produce one.

Further, although there is no need to dope an impurity into the AlGaN layer 103, it is preferable that a p-type impurity at an amount at a level of exerting no adverse effect on the crystallinity is doped into the AlGaN layer 103. This is because a band potential at an interface with the n-type GaN layer 102 can be further increased. As the p-type impurity, Mg can be employed, for example, and the amount of doping at a level of exerting no adverse effect on the crystallinity is the order of $10^{18}$ cm$^{-3}$, for example. If an activation rate of Mg is about 1%, Mg on the order of $10^{16}$ cm$^{-3}$ is activated.

Tenth Embodiment

Figure 20:
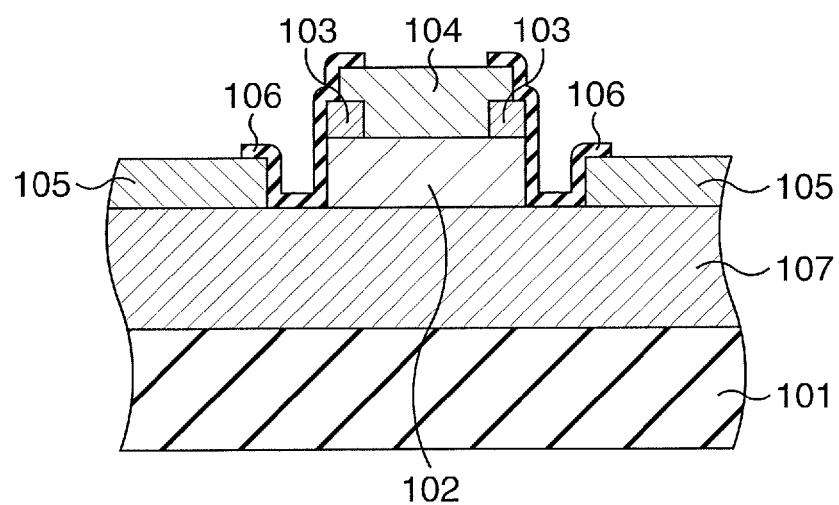
FIG. 20 is a sectional view illustrating a structure of a semiconductor device according to a tenth embodiment.

Next, a tenth embodiment will be described. FIG. 20 is a sectional view illustrating a structure of a semiconductor device (Schottky barrier diode) according to the tenth embodiment.

In the tenth embodiment, as illustrated in FIG. 20, an n$^+$GaN layer 107 into which an n-type impurity whose concentration is higher than that of the n-type GaN layer 102 is doped is formed over the sapphire substrate 101. Further, the n-type GaN layer 102 is formed between the AlGaN layer 103 and the anode electrode 104, and the n$^+$GaN layer 107, only at a position right below the AlGaN layer 103 and the anode electrode 104, and the cathode electrode 105 forms an ohmic junction with, not the n-type GaN layer 102, but the n$^+$GaN layer 107. The other structure is similar to that of the ninth embodiment.

Also in the Schottky barrier diode having a mesa structure as described above, it is possible to achieve an effect similar to that of the ninth embodiment. Further, since the cathode electrode 105 is connected to the n$^+$GaN layer 107 with high-concentration n-type impurity, it is possible to further reduce an ohmic resistance.

Eleventh Embodiment

Figure 21:
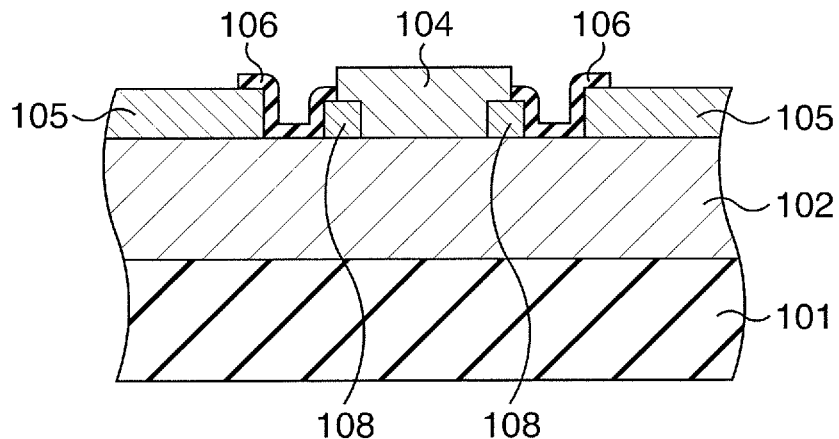
FIG. 21 is a sectional view illustrating a structure of a semiconductor device according to an eleventh embodiment.

Next, an eleventh embodiment will be described. FIG. 21 is a sectional view illustrating a structure of a semiconductor device (Schottky barrier diode) according to the eleventh embodiment.

In the eleventh embodiment, an InAlN layer 108 is formed instead of the AlGaN layer 103. The other structure is similar to that of the ninth embodiment.

Also in the eleventh embodiment, it is possible to achieve an effect similar to that of the ninth embodiment. Further, InAlN has a characteristic that it has a strong spontaneous polarization and a large band gap compared to AlGaN, so that it is possible to obtain a backward breakdown voltage higher than that of the ninth embodiment. Note that also when an InAlGaN layer is used instead of the InAlN layer 108, it is possible to achieve an effect similar to that of the eleventh embodiment.

Twelfth Embodiment

Figure 22:
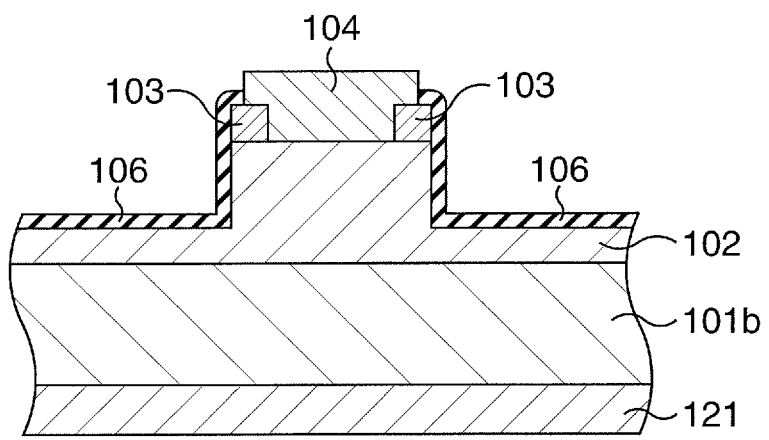
FIG. 22 is a sectional view illustrating a structure of a semiconductor device according to a twelfth embodiment.

Next, a twelfth embodiment will be described. FIG. 22 is a sectional view illustrating a structure of a semiconductor device (Schottky barrier diode) according to the twelfth embodiment.

In the twelfth embodiment, a conductive n-type GaN substrate 101b is used instead of the sapphire substrate 101. Further, as illustrated in FIG. 22, the cathode electrode 105 is not formed over the n-type GaN layer 102, and a cathode electrode 121 is formed on a rear surface of the n-type GaN substrate 101b. Further, the n-type GaN layer 102 is mesa-etched. The other structure is similar to that of the ninth embodiment.

Also in the Schottky barrier diode with a vertical structure as described above, it is possible to achieve an effect similar to that of the ninth embodiment. Further, space saving can be realized. Further, since the cathode electrode 121 may be formed without taking the position of the anode electrode 104 and the like into consideration, it is also possible to simplify the manufacturing process.

Thirteenth Embodiment

Figure 23:
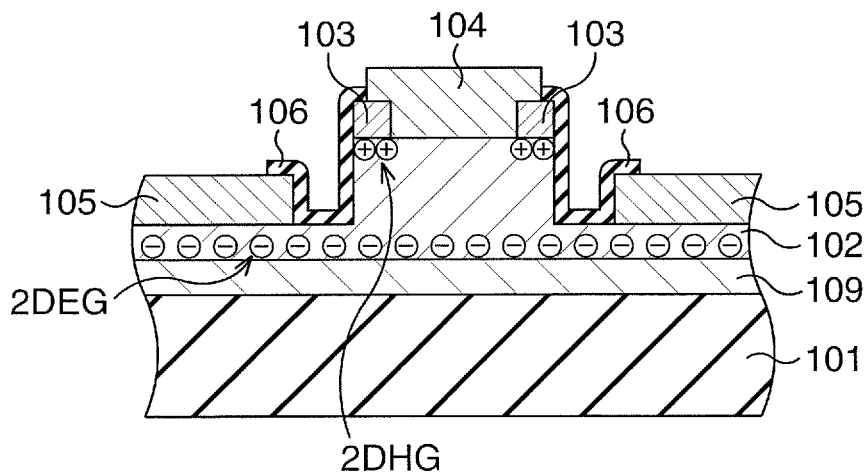
FIG. 23 is a sectional view illustrating a structure of a semiconductor device according to a thirteenth embodiment.

Next, a thirteenth embodiment will be described. In the ninth to twelfth embodiments, due to an extent of depletion layer right below the AlGaN layer 103, when compared to a case where the AlGaN layer 103 is not provided, a sheet resistance is increased, and an on-resistance is increased by an amount corresponding to the increase in the sheet resistance. In the thirteenth embodiment, high backward breakdown voltage and low on-resistance are realized with 2DEG. FIG. 23 is a sectional view illustrating a structure of a semiconductor device (Schottky barrier diode) according to the thirteenth embodiment.

In the thirteenth embodiment, as illustrated in FIG. 23, an AlGaN layer 109 is formed between the sapphire substrate 101 and the n-type GaN layer 102. Further, the n-type GaN layer 102 is mesa-etched. The other structure is similar to that of the ninth embodiment.

In the thirteenth embodiment as described above, high-concentration 2DEG exists in the vicinity of an interface of the n-type GaN layer 102 with the AlGaN layer 109 below the cathode electrode 105, as illustrated in FIG. 23. Therefore, it is possible to significantly reduce the sheet resistance compared to the ninth to twelfth embodiments. Accordingly, by setting the carrier concentration of the n-type GaN layer 102 to be lower than that of the ninth to twelfth embodiments, it is possible to further improve the backward breakdown voltage.

Figure 24A:
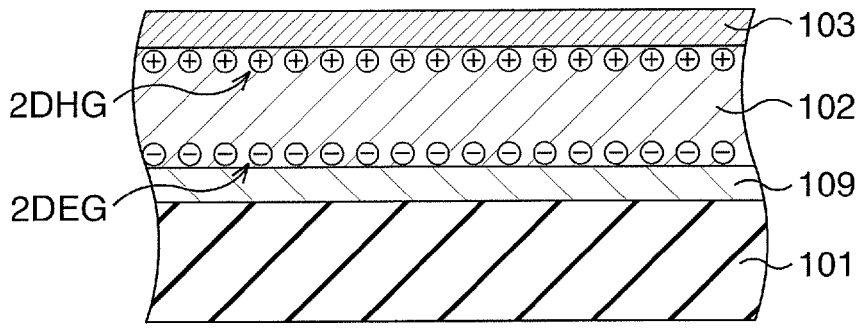
FIG. 24A is a sectional view illustrating a method of manufacturing the semiconductor device according to the thirteenth embodiment.
Figure 24B:
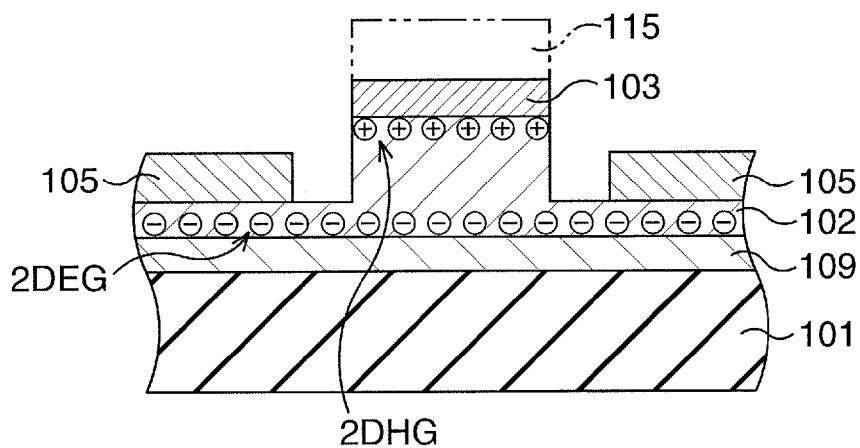
FIG. 24B is a sectional view illustrating the method of manufacturing the semiconductor device, continued from FIG. 24A.
Figure 24C:
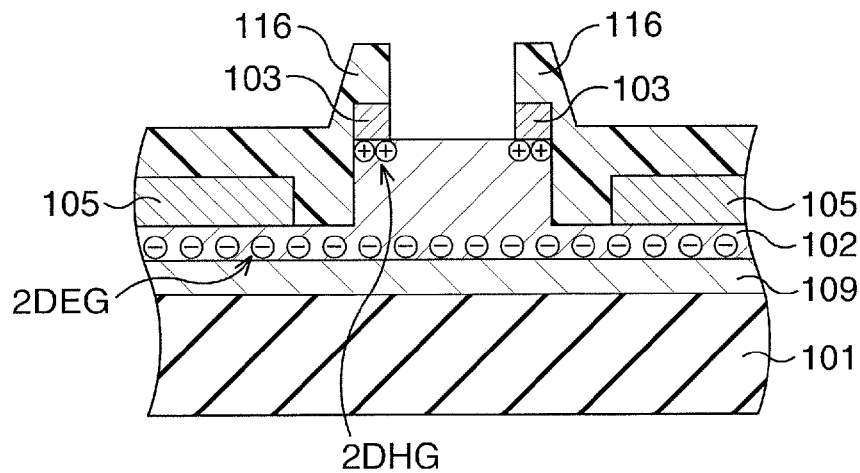
FIG. 24C is a sectional view illustrating the method of manufacturing the semiconductor device, continued from FIG. 24B.

Next, a method of manufacturing the semiconductor device according to the thirteenth embodiment will be described. FIG. 24A to FIG. 24C are sectional views illustrating the method of manufacturing the semiconductor device according to the thirteenth embodiment in the order of steps.

First, as illustrated in FIG. 24A, the AlGaN layer 109, the n-type GaN layer 102 and the AlGaN layer 103 are formed over the sapphire substrate 101 by the PAMBE method, for example. For example, a thickness of the AlGaN layer 109 is set to about 0.5 µm, and an Al composition is set to about 10%. For example, a thickness of the n-type GaN layer 102 is set to about 1 µm, and as an n-type impurity, Si of about $1 \times 10^{17}$ cm$^{-3}$ is doped. Further, for example, a thickness of the AlGaN layer 103 is set to about 20 nm, and an Al composition is set to about 25% to 30%. A growth temperature of these layers is set to about 720° C. As a result of this, because of the fixed charge caused by the polarization, 2DEG is induced in the vicinity of an interface of the n-type GaN layer 102 with the AlGaN layer 109, and two-dimensional hole gas (2DHG) is induced in the vicinity of an interface of the n-type GaN layer 102 with the AlGaN layer 103.

Then, as illustrated in FIG. 24B, a resist pattern 115 covering a region in which a mesa portion of the n-type GaN layer 102 is to be formed is formed over the AlGaN layer 103. The resist pattern 115 is formed by photolithography. Thereafter, the AlGaN layer 103 and the n-type GaN layer 102 are etched with the resist pattern 115 as an etching mask. At this time, the n-type GaN layer 102 is remained with a thickness of about 0.3 µm. Subsequently, the resist pattern 115 is removed, and similar to the ninth embodiment, the cathode electrode 105 is formed by a lift-off method.

Then, as illustrated in FIG. 24C, a resist pattern 116 having an opening at a Schottky junction surface of the n-type GaN layer 102 is formed. The resist pattern 116 is formed by photolithography. Thereafter, the AlGaN layer 103 is etched with the resist pattern 116 as an etching mask, to thereby make a front surface of the n-type GaN layer 102 being exposed in the region in which the Schottky junction surface is provided.

Subsequently, the resist pattern 116 is removed, and similar to the ninth embodiment, processing subsequent to the formation of the anode electrode 104 is performed (FIG. 19H to FIG. 19K). Thus, the structure illustrated in FIG. 23 is obtained.

Fourteenth Embodiment

Figure 25:
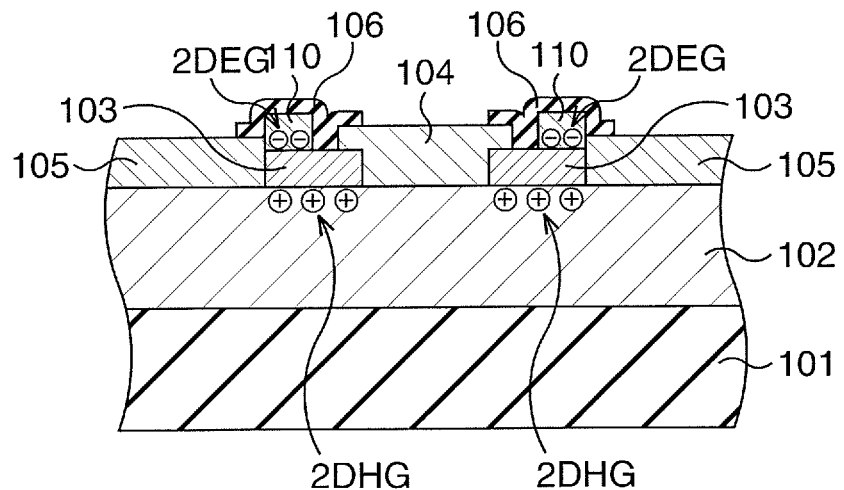
FIG. 25 is a sectional view illustrating a structure of a semiconductor device according to a fourteenth embodiment.

Next, a fourteenth embodiment will be described. In the fourteenth embodiment, high backward breakdown voltage and low on-resistance are realized with 2DEG. FIG. 25 is a sectional view illustrating a structure of a semiconductor device (Schottky barrier diode) according to the fourteenth embodiment.

In the fourteenth embodiment, as illustrated in FIG. 25, an n-type GaN layer 110 is formed over the AlGaN layer 103 apart from the anode electrode 104. Further, the passivation film 106 also covers the n-type GaN layer 110. The other structure is similar to that of the ninth embodiment.

In the fourteenth embodiment as described above, high-concentration 2DEG exists in the vicinity of an interface of the n-type GaN layer 110 with the AlGaN layer 103, as illustrated in FIG. 25. Therefore, it is possible to significantly reduce the sheet resistance compared to the ninth to twelfth embodiments. Accordingly, by setting the carrier concentration of the n-type GaN layer 102 to be lower than that of the ninth to twelfth embodiments, it is possible to further improve the backward breakdown voltage.

Figure 26A:
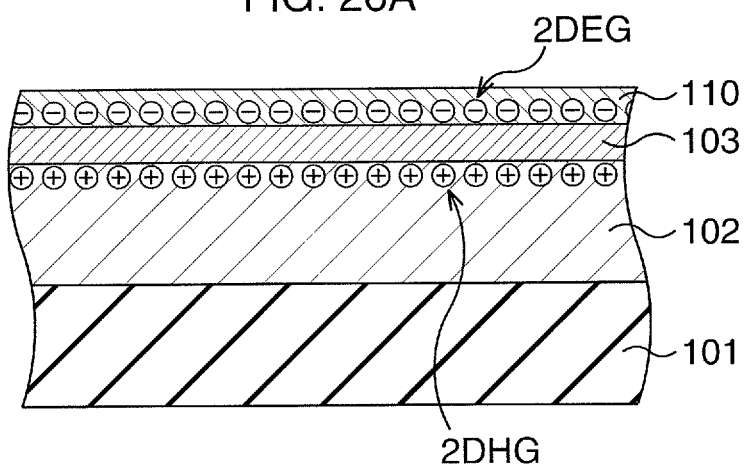
FIG. 26A is a sectional view illustrating a method of manufacturing the semiconductor device according to the fourteenth embodiment.
Figure 26B:
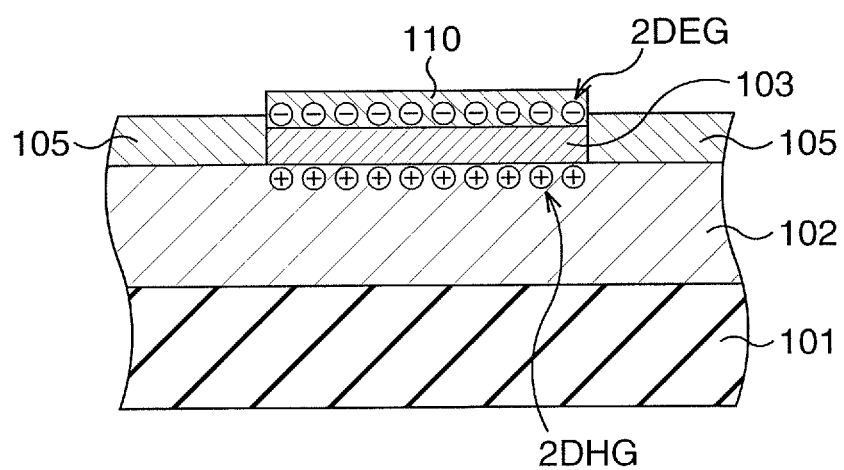
FIG. 26B is a sectional view illustrating the method of manufacturing the semiconductor device, continued from FIG. 26A.

Next, a method of manufacturing the semiconductor device according to the fourteenth embodiment will be described. FIG. 26A to FIG. 26C are sectional views illustrating the method of manufacturing the semiconductor device according to the fourteenth embodiment in the order of steps.

First, as illustrated in FIG. 26A, the n-type GaN layer 102, the AlGaN layer 103 and the n-type GaN layer 110 are formed over the sapphire substrate 101 by a PAMBE method, for example. For example, a thickness of the n-type GaN layer 102 is set to about 1 µm, and as an n-type impurity, Si of about $1 \times 10^{17}$ cm$^{-3}$ is doped. For example, a thickness of the AlGaN layer 103 is set to about 20 nm, and an Al composition is set to about 25% to 30%. A thickness of the n-type GaN layer 110 is set to about 0.1 µm, and as an n-type impurity, Si of about $1 \times 10^{17}$ cm$^{-3}$ is doped. A growth temperature of these layers is set to about 720° C. As a result of this, because of the fixed charge caused by the polarization, 2DHG is induced in the vicinity of an interface of the n-type GaN layer 102 with the AlGaN layer 103, and 2DEG is induced in the vicinity of the interface of the n-type GaN layer 110 with the AlGaN layer 103.

Then, as illustrated in FIG. 26B, similar to the ninth embodiment, a front surface of the n-type GaN layer 102 in the region in which the cathode electrode 105 is to be formed is exposed, and the cathode electrode 105 is formed over the exposed portion.

Thereafter, the n-type GaN layer 110 is etched with a resist pattern as an etching mask, and as illustrated in FIG. 26C, an opening exposing a center portion of the AlGaN layer 103 is formed in the n-type GaN layer 110. Subsequently, the resist pattern is removed, and the AlGaN layer 103 is etched with a new resist pattern as an etching mask, to thereby form an opening in the AlGaN layer 103 through which a Schottky junction surface of the n-type GaN layer 102 is exposed, as illustrated in FIG. 26C.

Then, similar to the ninth embodiment, processing subsequent to the formation of the anode electrode 104 is performed (FIG. 19G to FIG. 19K). Thus, the structure illustrated in FIG. 25 is obtained.

Fifteenth Embodiment

Next, a fifteenth embodiment will be described. FIG. 27 is a sectional view illustrating a structure of a semiconductor device (Schottky barrier diode) according to the fifteenth embodiment.

In the fifteenth embodiment, as illustrated in FIG. 27, one or more ring-shaped AlGaN layers 103a are formed between the AlGaN layer 103 and the cathode electrode 105. The AlGaN layer 103a has a thickness and an Al composition similar to those of the AlGaN layer 103. The passivation film 106 also covers the AlGaN layer 103a. The other structure is similar to that of the ninth embodiment.

Also in the fifteenth embodiment as described above, it is possible to achieve an effect similar to that of the ninth embodiment. Further, since the one or more ring-shaped AlGaN layers 103a are formed, namely, a multiple guard ring structure is employed, it is possible to obtain a higher backward breakdown voltage.

Figure 28B:
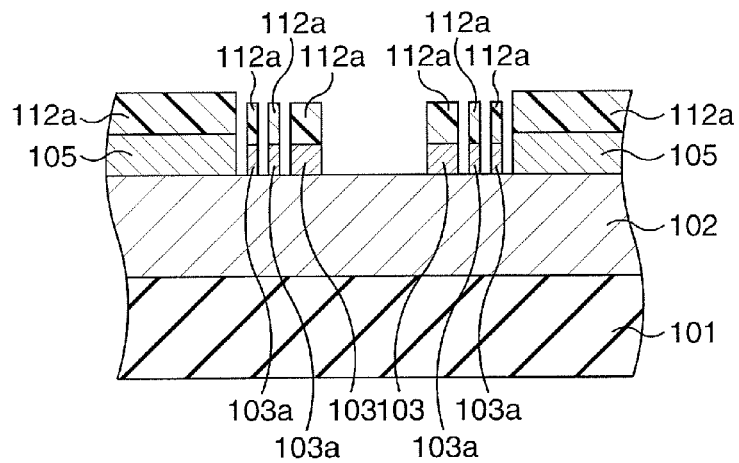
FIG. 28B is a sectional view illustrating the method of manufacturing the semiconductor device, continued from FIG. 28A.
Figure 28C:
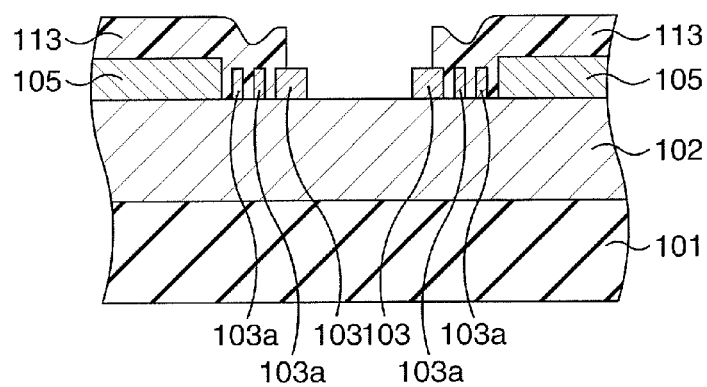
FIG. 28C is a sectional view illustrating the method of manufacturing the semiconductor device, continued from FIG. 28B.

Next, a method of manufacturing the semiconductor device according to the fifteenth embodiment will be described. FIG. 28A to FIG. 28C are sectional views illustrating the method of manufacturing the semiconductor device according to the fifteenth embodiment in the order of steps.

First, similar to the ninth embodiment, processing up to the formation of the cathode electrode 105 is performed (FIG. 19A to FIG. 19D). Then, as illustrated in FIG. 28A, a resist pattern 112a covering the cathode electrode 105 and covering parts of the AlGaN layer 103 which are to be remained as ring-shaped multiple guard rings is formed. The resist pattern 112a is formed by photolithography.

Then, as illustrated in FIG. 28B, the AlGaN layer 103 is etched with the resist pattern 112a as an etching mask, to thereby make a front surface of the n-type GaN layer 102 being exposed in a region in which a Schottky junction surface is provided and a region by which the anode electrode 104 and the cathode electrode 105 are isolated. At this time, in the region by which the anode electrode 104 and the cathode electrode 105 are isolated, the front surface of the n-type GaN layer 102 is exposed in ring shapes.

Thereafter, as illustrated in FIG. 28C, the resist pattern 112a is removed, and a resist pattern 113 having an opening at a region in which the anode electrode 104 is to be formed is formed, similar to the ninth embodiment.

Subsequently, similar to the ninth embodiment, processing subsequent to the formation of the anode electrode 104 is performed (FIG. 19H to FIG. 19K). Thus, the structure illustrated in FIG. 27 is obtained.

Sixteenth Embodiment

Figure 29:
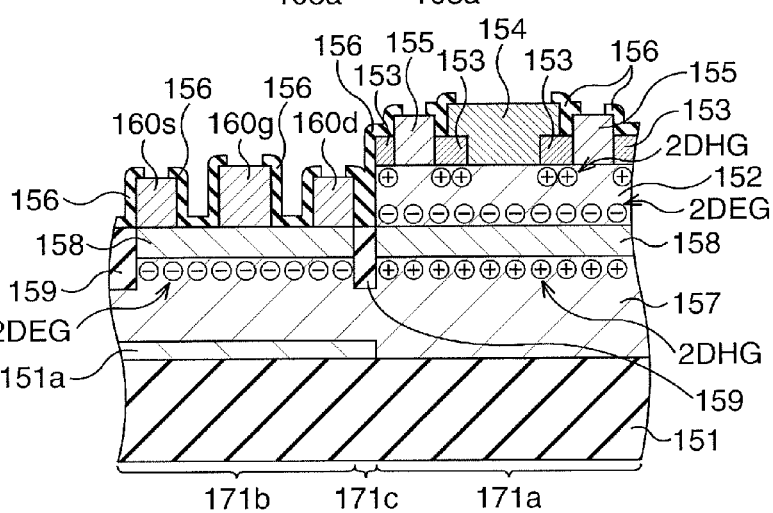
FIG. 29 is a sectional view illustrating a structure of a semiconductor device according to a sixteenth embodiment.

Next, a sixteenth embodiment will be described. In the sixteenth embodiment, a GaN-based SBD and a HEMT are provided on the same substrate. FIG. 29 is a sectional view illustrating a structure of a semiconductor device according to the sixteenth embodiment.

In the sixteenth embodiment, as illustrated in FIG. 29, an SBD region 171a and a HEMT region 171b sandwiching an element isolation region 171c are provided. A GaN layer 157 is formed over a sapphire substrate 151, and an n-type AlGaN layer 158 is formed over the GaN layer 157, in the SBD region 171a. An AlN nucleus formation layer 151a is formed over the sapphire substrate 151, the GaN layer 157 is formed over the AlN nucleus formation layer 151a, and the n-type AlGaN layer 158 is formed over the GaN layer 157, in the HEMT region 171b and the element isolation region 171c. Note that the AlN nucleus formation layer 151a may not be formed in the element isolation region 171c. An intentional doping of impurity into the GaN layer 157 is not conducted. A front surface of the GaN layer 157 over the sapphire substrate 151 has an N face in the SBD region 171a. Meanwhile, a front surface of the GaN layer 157 over the AlN nucleus formation layer 151a is a Ga face in the HEMT region 171b. An element isolation part 159 is formed in the n-type AlGaN layer 158 and a surface portion of the GaN layer 157 in the element isolation region 171c. Therefore, although 2DHG is induced in the vicinity of an interface of the GaN layer 157 with the n-type AlGaN layer 158 in the SBD region 171a and 2DEG is induced in the vicinity of an interface of the GaN layer 157 with the n-type AlGaN layer 158 in the HEMT region 171b, no 2DHG and 2DEG exists in the element isolation region 171c. The element isolation part 159 may be formed through a doping of boron ions or the like, a mesa formation, or the like.

An n-type GaN layer 152 is formed over the n-type AlGaN layer 158 In the SBD region 171a. 2DEG is induced in the vicinity of an interface of the n-type GaN layer 152 with the n-type AlGaN layer 158. Further, the ring-shaped AlGaN layers 153 are formed as guard rings over the n-type AlGaN layer 152. 2DHG is induced in the vicinity of an interface of the n-type GaN layer 152 with the n-type AlGaN layer 153. Further, an anode electrode (Schottky electrode) 154 that forms a Schottky junction with the n-type GaN layer 152 is formed on the inside of the AlGaN layer 153. The anode electrode 154 has a thickness greater than that of the AlGaN layer 153, and an outer peripheral portion of the anode electrode 154 is brought into contact with an upper surface of the AlGaN layer 153. Further, a cathode electrode (ohmic electrode) 155 that forms an ohmic junction with the n-type GaN layer 152 is formed apart from the AlGaN layer 153. Further, a passivation film 156 covering the n-type GaN layer 152 and the AlGaN layer 153 is formed between the anode electrode 154 and the cathode electrode 155. The passivation film 156 also covers, from above, a part of the anode electrode 154 and a part of the cathode electrode 155.

A gate electrode 160g is formed over the re-type AlGaN layer 158 in the HEMT region 171b. Further, a source electrode 160s and a drain electrode 160d are also formed over the n-type AlGaN layer 158 so as to sandwich the gate electrode 160g in a plan view. Further, the passivation film 156 covers the n-type AlGaN layer 158 between the gate electrode 160g and the source electrode 160s and between the gate electrode 160g and the drain electrode 160d. The passivation film 156 also covers, from above, a part of the gate electrode 160g, a part of the source electrode 160s and a part of the drain electrode 160d. The n-type AlGaN layer 158 functions as an electron supply layer, and the GaN layer 157 functions as an electron transit layer.

According to the sixteenth embodiment as described above, it is possible to realize an integration of GaN-based SBD and HEMT.

Next, a method of manufacturing the semiconductor device according to the sixteenth embodiment will be described. FIG. 30A to FIG. 30F are sectional views illustrating the method of manufacturing the semiconductor device according to the sixteenth embodiment in the order of steps.

First, as illustrated in FIG. 30A, the AlN nucleus formation layer 151a is formed over the sapphire substrate 151 by a PAMBE method, for example. For example, a thickness of the AlN nucleus formation layer 151a is set to about 25 nm, and a growth temperature of the layer is set to about 720° C. Then, a part of the AlN nucleus formation layer 151a in the SBD region 171a is removed by wet etching using KOH solution, dry etching using chlorine gas, argon ion milling, or the like. Thereafter, the GaN layer 157, the n-type AlGaN layer 158, the n-type GaN layer 152 and the AlGaN layer 153 are formed over the sapphire substrate 151 and the AlN nucleus formation layer 151a by a PAMBE method, for example. Since the AlN nucleus formation layer 151a is formed over the sapphire substrate 151 before forming the GaN layer 157, a front surface in a growth direction of the GaN layer 157 has a Ga face, in the HEMT region 171b. Therefore, 2DEG is induced in the vicinity of the interface of the GaN layer 157 with the n-type AlGaN layer 158 in the HEMT region 171b. Meanwhile, since the AlN nucleus formation layer 151a is removed, a front surface in the growth direction of the GaN layer 157 has an N face, in the SBD region 171a. Therefore, 2DHG is induced in the vicinity of the interface of the GaN layer 157 with the n-type AlGaN layer 158 in the SBD region 171a. Further, for example, a thickness of the GaN layer 157 is set to about 1 μm. For example, a thickness of the n-type AlGaN layer 158 is set to 20 nm, Si of about $1 \times 10^{18}$ cm$^{-3}$ is doped as an n-type impurity, and an Al composition is set to about 25% to 30%. For example, a thickness of the n-type GaN layer 152 is set to about 1 μm, and as an n-type impurity, Si of about $1 \times 10^{17}$ cm$^{-3}$ is doped. For example, a thickness of the AlGaN layer 153 is set to about 20 nm, and an Al composition is set to about 25% to 30%.

Subsequently, as illustrated in FIG. 30B, a resist pattern 161 covering the SBD region 171a and having an opening at the HEMT region 171b and the element isolation region 171c is formed over the AlGaN layer 153. The resist pattern 161 is formed by photolithography. Then, the AlGaN layer 153 and the n-type GaN layer 152 are dry-etched with the resist pattern 161 as an etching mask. As a result, the AlGaN layer 153 and the n-type GaN layer 152 disappear in the HEMT region 171b and the element isolation region 171c.

Thereafter, as illustrated in FIG. 30C, the resist pattern 161 is removed, and a resist pattern 162 covering the SBD region 171a and the HEMT region 171b and having an opening at the element isolation region 171c is formed over the AlGaN layer 153 and the n-type AlGaN layer 158. The resist pattern 162 is formed by photolithography. Thereafter, boron ions are injected into the n-type AlGaN layer 158 and the surface portion of the GaN layer 157, to thereby form the element isolation part 159. the element isolation part 159 may be formed through a mesa formation or the like.

Subsequently, as illustrated in FIG. 30D, the resist pattern 162 is removed, and a resist pattern 163 covering parts of the AlGaN layer 153 which are to be remained as ring-shaped guard rings is formed. The resist pattern 163 is formed by photolithography. Then, the AlGaN layer 153 is dry-etched with the resist pattern 163 as an etching mask.

Then, as illustrated in FIG. 30E, the resist pattern 163 is removed, and the cathode electrode 155 is formed over the n-type GaN layer 152 in the SBD region 171a, and the source electrode 160s and the drain electrode 160d are formed over the n-type AlGaN layer 158 in the HEMT region 171b, by a lift-off method, for example. A multi-layered body of a Ti film having a thickness of about 30 nm and an Al film over the Ti film having a thickness of about 300 nm is formed, for example, as each of the cathode electrode 155, the source electrode 160s, and the drain electrode 160d. The deposition of the Ti film and the Al film is performed by a vapor deposition method, for example. Subsequently, the RTA is conducted at about 600° C.

Thereafter, as illustrated in FIG. 30F, the anode electrode 154 and the gate electrode 160g are formed by a lift-off method, for example. A multi-layered body of a Ni film having a thickness of about 100 nm and an Au film over the Ni film having a thickness of about 300 nm is formed, for example, as each of the anode electrode 154 and the gate electrode 160g. The deposition of the Ni film and the Au film is conducted by a vapor deposition method, for example.

Thereafter, the passivation film 156 is formed in a similar manner to forming the passivation film 106 in the ninth embodiment. Thus, the structure illustrated in FIG. 29 is obtained.

Seventeenth Embodiment

Figure 31:
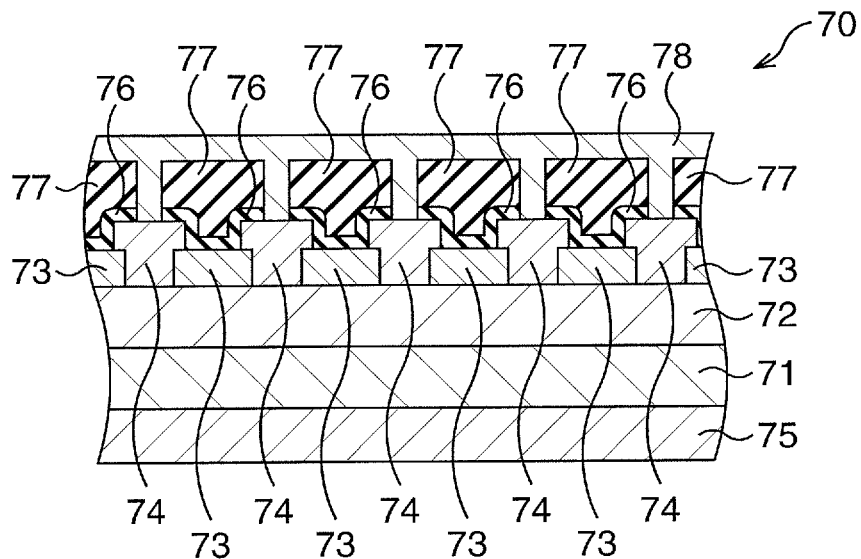
FIG. 31 is a sectional view illustrating a structure of a GaN-based SBD used in a seventeenth embodiment.
Figure 32:
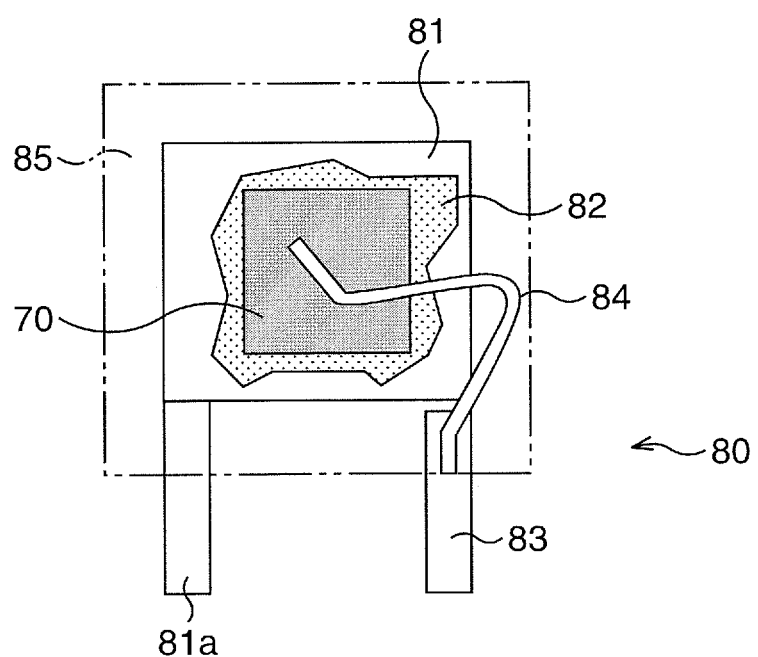
FIG. 32 is a diagram illustrating an SBD package including the GaN-based SBD illustrated in FIG. 31.
Figure 33:
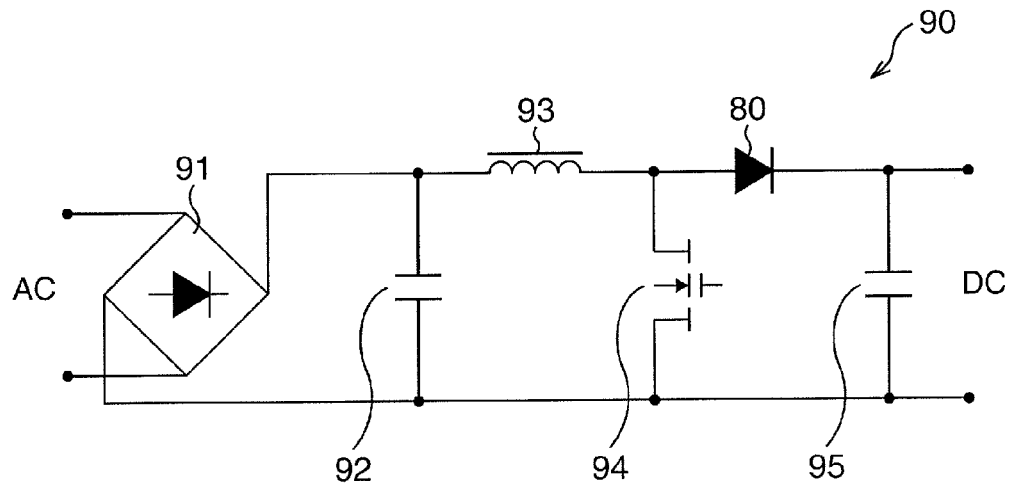
FIG. 33 is a diagram illustrating a PFC circuit including the SBD package illustrated in FIG. 32.
Figure 34:
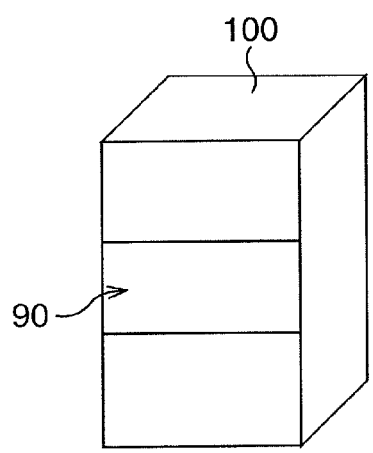
FIG. 34 is a diagram illustrating a server power supply including the PFC circuit illustrated in FIG. 33.

Next, a seventeenth embodiment will be described. The seventeenth embodiment is a device of a server power supply or the like including a GaN-based SBD. FIG. 31 is a sectional view illustrating a structure of a GaN-based SBD used in the seventeenth embodiment. FIG. 32 is a diagram illustrating an SBD package including the GaN-based SBD illustrated in FIG. 31. FIG. 33 is a diagram illustrating a PFC (power factor correction) circuit including the SBD package illustrated in FIG. 32. FIG. 34 is a diagram illustrating a server power supply including the PFC circuit illustrated in FIG. 33.

As illustrated in FIG. 31, a GaN-based SBD 70 used in the seventeenth embodiment has a structure in which the semiconductor devices according to the twelfth embodiment illustrated in FIG. 22 are gathered. Specifically, an n-type GaN layer 72 is formed over a conductive n-type GaN substrate 71, and an AlGaN layer 73 and anode electrodes 74 are formed over the n-type GaN layer 72. Further, a passivation film 76 is also formed, and an interlayer insulating film 77 is formed over the passivation film 76. Further, a wiring 78 connected to the respective anode electrodes 74 via contact holes of the interlayer insulating film 77 is formed over the interlayer insulating film 77. Further, a cathode electrode 75 is formed on a rear surface of the n-type GaN substrate 71.

In an SBD package 80 including the GaN-based SBD 70, as illustrated in FIG. 32, the cathode electrode 75 of the GaN-based SBD 70 is fixed to a package electrode base 81 with a mounting material 82 such as a solder. A lead 81a is connected to the package electrode base 81. Further, the wiring 78 connected to the anode electrodes 74 of the GaN-based SBD 70 is connected to another lead 83 by bonding with an Al wire 84. Further, these components are sealed by a molding resin 85.

In a PFC circuit 90 including the SBD package 80, as illustrated in FIG. 33, one terminal of a choke coil 93 and one terminal of a switch element 94 are connected to the lead 83 connected to the anode electrodes 74 of the GaN-based SBD 70, and one terminal of a capacitor 95 is connected to the lead 81a connected to the cathode electrode 75. A capacitor 92 is connected to the other terminal of the choke coil 93. Further, the other terminal of the capacitor 92, the other terminal of the switch element 94, and the other terminal of the capacitor 95 are grounded. Further, an alternating-current power supply (AC) is connected to the capacitor 92 via a diode bridge 91. Further, a direct-current power supply (DC) is taken out between both terminals of the capacitor 95.

Further, as illustrated in FIG. 34, the PFC circuit 90 may be used with being incorporated into a server power supply 100 or the like.

A power supply device similar to the server power supply 100 as described above with higher reliability may be constructed.

According to the above-described semiconductor device and the like, a band potential of a Ga face or an N face of a GaN layer is increased by an InGaN layer or a nitride semiconductor layer containing Al, resulting in that a backward breakdown voltage can be improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
    a GaN layer;
    an anode electrode that forms a Schottky junction with a Ga face of the GaN layer;
    an InGaN layer positioned between at least a part of the anode electrode and the GaN layer;
    an AlGaN or InAlN layer over the InGaN layer; and
    a cathode electrode over the AlGaN or InAlN layer, the cathode electrode forming an ohmic junction with the GaN layer, and a part of the AlGaN or InAlN layer being between the anode electrode and the cathode electrode in a plan view, wherein
    a lower surface of the InGaN layer is in direct contact with an upper surface of the GaN layer just below an outer peripheral end of the anode electrode.

2. The semiconductor device according to claim 1,
    wherein the InGaN layer is positioned below the outer peripheral end of the anode electrode in a plan view.

3. The semiconductor device according to claim 2, further comprising a metal layer formed over the InGaN layer and having a work function higher than that of the anode electrode,
    wherein the anode electrode covers at least a part of the metal layer.

4. The semiconductor device according to claim 1, further comprising:
    a second InGaN layer formed in a same layer as the InGaN layer between the anode electrode and the cathode electrode in a plan view.

5. The semiconductor device according to claim 1, wherein the AlGaN or InAlN layer is between the InGaN layer and the cathode electrode in a thickness direction of the GaN layer.

6. The semiconductor device according to claim 1, further comprising a transistor that uses the GaN layer as an electron transit layer.

7. A semiconductor device, comprising:
    a first GaN layer;
    an anode electrode that forms a Schottky junction with an N face of the first GaN layer;
    a nitride semiconductor layer containing Al, having a band gap larger than that of GaN, and positioned between at least a part of the anode electrode and the first GaN layer;
    a second GaN layer away from the anode electrode in a plan view over the nitride semiconductor layer; and
    a cathode electrode over the first GaN layer, the cathode electrode forming an ohmic junction with the first GaN layer, and the second GaN layer being between the anode electrode and the cathode electrode in a plan view, wherein
    a lower surface of the nitride semiconductor layer is in direct contact with an upper surface of the first GaN layer just below an outer peripheral end of the anode electrode.

8. The semiconductor device according to claim 7, wherein the nitride semiconductor layer is an AlGaN layer, an InAlN layer or an InAlGaN layer.

9. The semiconductor device according to claim 7, wherein the nitride semiconductor layer is positioned below the outer peripheral end of the anode electrode in a plan view.

10. The semiconductor device according to claim 7, further comprising:
a second nitride semiconductor layer containing Al, having a band gap larger than that of GaN, formed in a same layer as the nitride semiconductor layer, and positioned between the anode electrode and the cathode electrode in a plan view.

11. The semiconductor device according to claim 7, further comprising a transistor that uses the first GaN layer as an electron transit layer.

12. A manufacturing method of a semiconductor device, comprising:
locally forming an InGaN layer over a Ga face of a GaN layer;
forming an anode electrode that forms a Schottky junction with the GaN layer so as to make the InGaN layer to be positioned between at least a part of the anode electrode and the GaN layer;
forming an AlGaN or InAlN layer over the InGaN layer; and
forming a cathode electrode over the AlGaN or InAlN layer, the cathode electrode forming an ohmic junction with the GaN layer, and a part of the AlGaN or InAlN layer being between the anode electrode and the cathode electrode in a plan view, wherein
a lower surface of the InGaN layer is in direct contact with an upper surface of the GaN layer just below an outer peripheral end of the anode electrode.

13. The manufacturing method of the semiconductor device according to claim 12, wherein the locally forming the InGaN layer comprises:
forming a raw material layer of the InGaN layer over a whole surface of the GaN layer;
locally forming a light-shielding mask over the raw material layer; and
performing photo electrochemical etching of the raw material layer using the light-shielding mask to obtain the InGaN layer by.

14. The manufacturing method of the semiconductor device according to claim 13, wherein a metal layer having a work function higher than that of the anode electrode is used as the light-shielding mask.

15. A manufacturing method of a semiconductor device, comprising:
locally forming a nitride semiconductor layer containing Al and having a band gap larger than that of GaN over an N face of a first GaN layer;
forming an anode electrode that forms a Schottky junction with the nitride semiconductor layer so as to make the nitride semiconductor layer to be positioned between at least a part of the anode electrode and the first GaN layer;
forming a second GaN layer away from the anode electrode in a plan view over the nitride semiconductor layer; and
forming a cathode electrode over the first GaN layer, the cathode electrode forming an ohmic junction with the first GaN layer, and the second GaN layer being between the anode electrode and the cathode electrode in a plan view, wherein
a lower surface of the nitride semiconductor layer is in direct contact with an upper surface of the first GaN layer just below an outer peripheral end of the anode electrode.

* * * * *